(12) United States Patent
Farrar

(10) Patent No.: US 7,504,674 B2
(45) Date of Patent: Mar. 17, 2009

(54) ELECTRONIC APPARATUS HAVING A CORE CONDUCTIVE STRUCTURE WITHIN AN INSULATING LAYER

(75) Inventor: Paul A. Farrar, Bluffton, SC (US)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 11/215,367

(22) Filed: Aug. 29, 2005

(65) Prior Publication Data

US 2006/0006548 A1  Jan. 12, 2006

Related U.S. Application Data

(62) Division of application No. 10/634,274, filed on Aug. 5, 2003, now Pat. No. 7,220,665.

(51) Int. Cl.
*H01L 23/535* (2006.01)
(52) U.S. Cl. .............. 257/213; 257/751; 257/753; 257/758; 257/762; 257/767; 257/774
(58) Field of Classification Search .............. 257/751, 257/753, 758, 762, 773, 774, E23.144, E23.145, 257/E23.154, E23.155, 767, E23.011, E23.146
See application file for complete search history.

(56) References Cited

U.S. PATENT DOCUMENTS

| | | | |
|---|---|---|---|
| 2,842,438 A | 7/1958 | Saarivirta et al. | |
| 3,954,570 A | 5/1976 | Shirk et al. | |
| 4,386,116 A | 5/1983 | Nair et al. | |
| 4,394,223 A | 7/1983 | Hall | |
| 4,423,547 A | 1/1984 | Farrar et al. | |
| 4,565,157 A | 1/1986 | Brors et al. | |
| 4,574,095 A | 3/1986 | Baum et al. | |

(Continued)

FOREIGN PATENT DOCUMENTS

JP    5-267643    10/1993

(Continued)

OTHER PUBLICATIONS

"Improved Metallurgy for Wiring Very Large Scale Integrated Circuits", *International Technology Disclosures*, 4, Abstract,(1986),1 page.

(Continued)

*Primary Examiner*—Ngan Ngo
*Assistant Examiner*—Benjamin Tzu-Hung Liu
(74) *Attorney, Agent, or Firm*—Schwegman, Lundberg & Woessner, P.A.

(57) ABSTRACT

Electronic devices are constructed by a method that includes forming a first conductive layer in an opening in a multilayer dielectric structure supported by a substrate, forming a core conductive layer on the first conductive layer, subjecting the core conductive layer to a $H_2$ plasma treatment, and depositing a capping adhesion/barrier layer on the core conductive layer after the $H_2$ plasma treatment. The multilayer dielectric structure provides an insulating layer for around the core conducting layer. The $H_2$ plasma treatment removes unwanted oxide from the surface region of the core conducting layer such that the interface between the core conducting layer and the capping adhesion/barrier is substantially free of oxides.

50 Claims, 14 Drawing Sheets

U.S. PATENT DOCUMENTS

| | | | |
|---|---|---|---|
| 4,762,728 A | 8/1988 | Keyser et al. | |
| 4,788,082 A | 11/1988 | Schmitt | |
| 4,847,111 A | 7/1989 | Chow et al. | |
| 4,931,410 A | 6/1990 | Tokunaga et al. | |
| 4,948,459 A | 8/1990 | Van Laarhoven et al. | |
| 4,962,058 A | 10/1990 | Cronin et al. | |
| 4,996,584 A | 2/1991 | Young et al. | |
| 5,019,531 A | 5/1991 | Awaya et al. | |
| 5,034,799 A | 7/1991 | Tomita et al. | |
| 5,084,412 A | 1/1992 | Nakasaki | |
| 5,100,499 A | 3/1992 | Douglas | |
| 5,130,274 A | 7/1992 | Harper et al. | |
| 5,149,615 A | 9/1992 | Chakravorty et al. | |
| 5,158,986 A | 10/1992 | Cha et al. | |
| 5,171,712 A | 12/1992 | Wang et al. | |
| 5,173,442 A | 12/1992 | Carey | |
| 5,231,056 A | 7/1993 | Sandhu | |
| 5,240,878 A | 8/1993 | Fitzsimmons et al. | |
| 5,243,222 A | 9/1993 | Harper et al. | |
| 5,256,205 A | 10/1993 | Schmitt, III et al. | |
| 5,334,356 A | 8/1994 | Baldwin et al. | |
| 5,354,712 A | 10/1994 | Ho et al. | |
| 5,371,042 A | 12/1994 | Ong | |
| 5,384,284 A | 1/1995 | Doan et al. | |
| 5,413,687 A | 5/1995 | Barton et al. | |
| 5,426,330 A | 6/1995 | Joshi et al. | |
| 5,442,237 A | 8/1995 | Hughes et al. | |
| 5,447,887 A | 9/1995 | Filipiak et al. | |
| 5,451,804 A | 9/1995 | Lur et al. | |
| 5,461,243 A | 10/1995 | Ek et al. | |
| 5,470,789 A | 11/1995 | Misawa | |
| 5,470,801 A | 11/1995 | Kapoor et al. | |
| 5,476,817 A | 12/1995 | Numata | |
| 5,495,667 A | 3/1996 | Farnworth et al. | |
| 5,506,449 A | 4/1996 | Nakano et al. | |
| 5,529,956 A | 6/1996 | Morishita | |
| 5,538,922 A | 7/1996 | Cooper et al. | |
| 5,539,060 A | 7/1996 | Tsunogae et al. | |
| 5,595,937 A | 1/1997 | Mikagi | |
| 5,609,721 A | 3/1997 | Tsukune et al. | |
| 5,625,232 A | 4/1997 | Numata et al. | |
| 5,625,233 A | 4/1997 | Cabral, Jr. et al. | |
| 5,635,253 A | 6/1997 | Canaperi et al. | |
| 5,635,423 A | 6/1997 | Huang et al. | |
| 5,654,245 A | 8/1997 | Allen | |
| 5,662,788 A | 9/1997 | Sandhu et al. | |
| 5,670,420 A | 9/1997 | Choi | |
| 5,674,787 A | 10/1997 | Zhao et al. | |
| 5,675,187 A | 10/1997 | Numata et al. | |
| 5,679,608 A | 10/1997 | Cheung et al. | |
| 5,681,441 A | 10/1997 | Svendsen et al. | |
| 5,695,810 A | 12/1997 | Dubin et al. | |
| 5,719,089 A | 2/1998 | Cherng et al. | |
| 5,719,410 A | 2/1998 | Suehiro et al. | |
| 5,739,579 A | 4/1998 | Chiang et al. | |
| 5,763,953 A | 6/1998 | Iijima et al. | |
| 5,780,358 A | 7/1998 | Zhou | |
| 5,785,570 A | 7/1998 | Bruni | |
| 5,792,522 A | 8/1998 | Jin et al. | |
| 5,801,098 A | 9/1998 | Fiordalice et al. | |
| 5,814,557 A | 9/1998 | Venkatraman et al. | |
| 5,821,168 A | 10/1998 | Jain | |
| 5,824,599 A | 10/1998 | Schacham-Diamond et al. | |
| 5,858,877 A | 1/1999 | Dennison et al. | |
| 5,891,797 A | 4/1999 | Farrar | |
| 5,891,804 A | 4/1999 | Havemann et al. | |
| 5,893,752 A | 4/1999 | Zhang et al. | |
| 5,895,740 A | 4/1999 | Chien et al. | |
| 5,897,370 A | 4/1999 | Joshi et al. | |
| 5,907,772 A | 5/1999 | Iwasaki | |
| 5,911,113 A | 6/1999 | Yao et al. | |
| 5,913,147 A | 6/1999 | Dubin et al. | |
| 5,925,930 A | 7/1999 | Farnworth et al. | |
| 5,930,669 A | 7/1999 | Uzoh | |
| 5,932,928 A | 8/1999 | Clampitt | |
| 5,933,758 A | 8/1999 | Jain | |
| 5,940,733 A | 8/1999 | Beinglass et al. | |
| 5,948,467 A | 9/1999 | Nguyen et al. | |
| 5,962,923 A | 10/1999 | Xu et al. | |
| 5,968,333 A | 10/1999 | Nogami et al. | |
| 5,969,422 A | 10/1999 | Ting et al. | |
| 5,972,179 A | 10/1999 | Chittipeddi et al. | |
| 5,972,804 A | 10/1999 | Tobin et al. | |
| 5,976,710 A | 11/1999 | Sachdev et al. | |
| 5,981,350 A | 11/1999 | Geusic et al. | |
| 5,985,759 A | 11/1999 | Kim et al. | |
| 5,985,762 A | 11/1999 | Geffken et al. | |
| 5,989,623 A | 11/1999 | Chen et al. | |
| 5,994,777 A | 11/1999 | Farrar | |
| 6,001,730 A | 12/1999 | Farkas et al. | |
| 6,001,736 A | 12/1999 | Kondo et al. | |
| 6,008,117 A | 12/1999 | Hong et al. | |
| 6,015,465 A | 1/2000 | Kholodenko et al. | |
| 6,016,000 A | 1/2000 | Moslehi | |
| 6,017,820 A | 1/2000 | Ting et al. | |
| 6,020,243 A | 2/2000 | Wallace et al. | |
| 6,028,362 A * | 2/2000 | Omura | 257/774 |
| 6,030,877 A | 2/2000 | Lee et al. | |
| 6,037,248 A | 3/2000 | Ahn | |
| 6,037,664 A | 3/2000 | Zhao et al. | |
| 6,051,858 A | 4/2000 | Uchida et al. | |
| 6,054,172 A | 4/2000 | Robinson et al. | |
| 6,054,398 A | 4/2000 | Pramanick | |
| 6,065,424 A | 5/2000 | Shacham-Diamand et al. | |
| 6,069,068 A | 5/2000 | Rathore et al. | |
| 6,071,810 A | 6/2000 | Wada et al. | |
| 6,077,792 A | 6/2000 | Farrar | |
| 6,090,697 A | 7/2000 | Xing et al. | |
| 6,100,193 A | 8/2000 | Suehiro et al. | |
| 6,107,186 A | 8/2000 | Erb | |
| 6,117,781 A | 9/2000 | Lukanc et al. | |
| 6,117,782 A | 9/2000 | Lukanc | |
| 6,120,641 A | 9/2000 | Stevens et al. | |
| 6,121,149 A | 9/2000 | Lukanc et al. | |
| 6,121,150 A | 9/2000 | Avanzino et al. | |
| 6,126,989 A | 10/2000 | Robinson et al. | |
| 6,130,161 A * | 10/2000 | Ashley et al. | 438/687 |
| 6,136,095 A | 10/2000 | Xu et al. | |
| 6,139,699 A | 10/2000 | Chiang et al. | |
| 6,140,228 A | 10/2000 | Shan et al. | |
| 6,140,234 A | 10/2000 | Uzoh et al. | |
| 6,143,604 A | 11/2000 | Chiang et al. | |
| 6,143,646 A | 11/2000 | Wetzel | |
| 6,143,650 A | 11/2000 | Pramanick et al. | |
| 6,150,261 A | 11/2000 | Hsu et al. | |
| 6,153,507 A | 11/2000 | Mikagi | |
| 6,159,769 A | 12/2000 | Farnworth et al. | |
| 6,162,583 A | 12/2000 | Yang et al. | |
| 6,168,704 B1 | 1/2001 | Brown et al. | |
| 6,171,661 B1 | 1/2001 | Zheng et al. | |
| 6,174,800 B1 | 1/2001 | Jang | |
| 6,177,350 B1 | 1/2001 | Sundarrajan et al. | |
| 6,181,012 B1 | 1/2001 | Edelstein et al. | |
| 6,183,564 B1 | 2/2001 | Reynolds et al. | |
| 6,184,121 B1 | 2/2001 | Buchwalter et al. | |
| 6,187,248 B1 | 2/2001 | O'Neill et al. | |
| 6,187,656 B1 | 2/2001 | Lu et al. | |
| 6,190,732 B1 | 2/2001 | Omstead et al. | |
| 6,194,317 B1 | 2/2001 | Kaisaki et al. | |
| 6,197,688 B1 | 3/2001 | Simpson | |
| 6,204,096 B1 | 3/2001 | Lai et al. | |
| 6,207,222 B1 | 3/2001 | Chen et al. | |
| 6,207,553 B1 | 3/2001 | Buynoski et al. | |
| 6,207,558 B1 | 3/2001 | Singhvi et al. | |

| | | |
|---|---|---|
| 6,208,016 B1 | 3/2001 | Farrar |
| 6,211,049 B1 | 4/2001 | Farrar |
| 6,211,071 B1 | 4/2001 | Lukanc et al. |
| 6,211,073 B1 | 4/2001 | Ahn |
| 6,211,090 B1 * | 4/2001 | Durlam et al. ............. 438/692 |
| 6,221,763 B1 | 4/2001 | Gilton |
| 6,224,690 B1 | 5/2001 | Andricacos et al. |
| 6,228,754 B1 | 5/2001 | Iacoponi et al. |
| 6,232,219 B1 | 5/2001 | Blalock et al. |
| 6,232,230 B1 | 5/2001 | Iacoponi |
| 6,239,017 B1 | 5/2001 | Lou et al. |
| 6,249,056 B1 | 6/2001 | Kwon et al. |
| 6,255,217 B1 | 7/2001 | Agnello et al. |
| 6,261,946 B1 | 7/2001 | Iacoponi et al. |
| 6,262,376 B1 | 7/2001 | Hurwitz et al. |
| 6,265,311 B1 | 7/2001 | Hautala et al. |
| 6,271,592 B1 | 8/2001 | Kim et al. |
| 6,277,263 B1 | 8/2001 | Chen |
| 6,280,640 B1 | 8/2001 | Hurwitz et al. |
| 6,284,656 B1 | 9/2001 | Farrar |
| 6,287,954 B1 | 9/2001 | Ashley et al. |
| 6,288,442 B1 | 9/2001 | Farrar |
| 6,288,448 B1 * | 9/2001 | Pramanick ................. 257/760 |
| 6,290,833 B1 | 9/2001 | Chen |
| 6,313,035 B1 | 11/2001 | Sandhu et al. |
| 6,319,834 B1 | 11/2001 | Erb et al. |
| 6,323,553 B1 | 11/2001 | Hsu et al. |
| 6,326,303 B1 | 12/2001 | Robinson et al. |
| 6,342,448 B1 | 1/2002 | Lin et al. |
| 6,350,678 B1 | 2/2002 | Pramanick et al. |
| 6,350,687 B1 | 2/2002 | Avanzino et al. |
| 6,358,842 B1 | 3/2002 | Zhou et al. |
| 6,358,849 B1 | 3/2002 | Havemann et al. |
| 6,359,328 B1 | 3/2002 | Dubin |
| 6,368,965 B1 | 4/2002 | Lopatin |
| 6,368,966 B1 | 4/2002 | Krishnamoorthy et al. |
| 6,372,622 B1 | 4/2002 | Tan et al. |
| 6,376,368 B1 | 4/2002 | Jung et al. |
| 6,376,370 B1 * | 4/2002 | Farrar ........................ 438/678 |
| 6,383,920 B1 | 5/2002 | Wang et al. |
| 6,387,542 B1 | 5/2002 | Kozlov et al. |
| 6,399,489 B1 | 6/2002 | M'Saad et al. |
| 6,403,481 B1 | 6/2002 | Matsuda et al. |
| 6,410,418 B1 | 6/2002 | Yang |
| 6,410,442 B1 | 6/2002 | Yang |
| 6,420,262 B1 | 7/2002 | Farrar |
| 6,420,702 B1 | 7/2002 | Tripsas et al. |
| 6,426,289 B1 | 7/2002 | Farrar |
| 6,428,673 B1 | 8/2002 | Ritzdorf et al. |
| 6,429,120 B1 | 8/2002 | Ahn et al. |
| 6,448,331 B1 | 9/2002 | Ioka et al. |
| 6,486,533 B2 | 11/2002 | Krishnamoorthy et al. |
| 6,503,796 B1 | 1/2003 | Tu |
| 6,508,920 B1 | 1/2003 | Ritzdorf et al. |
| 6,515,323 B1 | 2/2003 | Jung et al. |
| 6,518,173 B1 | 2/2003 | Chan |
| 6,518,198 B1 | 2/2003 | Klein |
| 6,552,432 B2 | 4/2003 | Farrar |
| 6,562,416 B2 | 5/2003 | Ngo et al. |
| 6,565,729 B2 | 5/2003 | Chen et al. |
| 6,573,182 B2 | 6/2003 | Sandhu et al. |
| 6,576,982 B1 | 6/2003 | You et al. |
| 6,614,099 B2 | 9/2003 | Farrar |
| 6,632,345 B1 | 10/2003 | Chen |
| 6,638,410 B2 | 10/2003 | Chen et al. |
| 6,646,347 B2 | 11/2003 | Mercado et al. |
| 6,664,197 B2 | 12/2003 | Stevens et al. |
| 6,674,169 B2 | 1/2004 | Sandhu et al. |
| 6,686,270 B1 * | 2/2004 | Subramanian et al. ...... 438/629 |
| 6,709,919 B2 | 3/2004 | Tu |
| 6,710,447 B1 | 3/2004 | Nogami |
| 6,737,725 B2 | 5/2004 | Grill et al. |
| 6,740,392 B1 | 5/2004 | Farrar |
| 6,743,716 B2 | 6/2004 | Farrar |
| 6,756,298 B2 | 6/2004 | Ahn et al. |
| 6,803,309 B2 | 10/2004 | Chou et al. |
| 6,833,289 B2 | 12/2004 | Hu et al. |
| 6,846,756 B2 | 1/2005 | Pan et al. |
| 6,888,246 B2 | 5/2005 | Mercado et al. |
| 7,105,914 B2 | 9/2006 | Farrar |
| 7,301,190 B2 | 11/2007 | Farrar |
| 7,378,737 B2 | 5/2008 | Farrar |
| 7,394,157 B2 | 7/2008 | Farrar |
| 2001/0002333 A1 | 5/2001 | Huang et al. |
| 2002/0014646 A1 | 2/2002 | Tsu et al. |
| 2002/0028552 A1 | 3/2002 | Lee et al. |
| 2002/0096768 A1 | 7/2002 | Joshi |
| 2002/0109233 A1 | 8/2002 | Farrar |
| 2002/0115292 A1 | 8/2002 | Andricacos et al. |
| 2002/0177302 A1 | 11/2002 | Farrar |
| 2002/0182859 A1 | 12/2002 | Farrar |
| 2004/0161924 A1 | 8/2004 | Chen et al. |
| 2005/0032352 A1 | 2/2005 | Farrar |
| 2006/0255462 A1 | 11/2006 | Farrar |

FOREIGN PATENT DOCUMENTS

| | | |
|---|---|---|
| JP | 05160826 | 3/1995 |
| JP | 07078815 | 3/1995 |
| JP | 07-321111 | 8/1995 |

OTHER PUBLICATIONS

Abe, K., et al., "Sub-half Micron Copper Interconnects Using Reflow of Sputtered Copper Films", *VLSI Multilevel Interconnection Conference*, (Jun. 25-27, 1995),308-311.

American Society for Metals, "Metals Handbook", *Properties and Selection: Nonferrous Alloys and Pure Metals*, Ninth Edition, vol. 2, Metals Park, Ohio : American Society for Metals,(1989),157, 395.

American Society for Metals, "Metals Handbook", *Metals Park, Ohio : American Society for Metals*, 8th Edition, vol. 8, (1973),300-302.

Andricacos, P. C., "Copper On-Chip Interconnections", *The Electrochemical Society Interface*, (1999),32-37.

Anonymous, "Formation of Conductors at Variable Depths—Using Differential Photomask, Projecting Images into Insulator by Reactive Ion Etching, Selectively Filling Images with Conductor", *Research Disclosure*, Disclosure No. RD 291015, Abstract,(Jul. 10, 1988),1 page.

Bae, Sanghoon, et al., "Low-Temperature Deposition Pathways to Silicon Nitride, Amorphous Silicon, Polycrystalline Silicon, and n type Amorphous Silicon Films Using a High Density Plasma System", *IEEE Conference Records—Abstracts, International Conference on Plasma Science*, (1997),315.

Bai, G., "Copper Interconnection Deposition Techniques and Integration", *1996 Symposium on VLSI Technology*, Digest of Technical Papers,(1996),48-49.

Bernier, M., et al., "Laser processing of palladium for selective electroless copper plating", *SPIE*, 2045, (1994),330-337.

Bhansali, S., et al., "A novel technique for fabrication of metallic structures on polymide by selective electroless copper plating using ion implantation", *Thin Solid Films*, 270, No. 1/02, (1995),489-492.

Bhansali, S., et al., "Selective electroless copper plating on silicon seeded by copper ion implantation", *Thin Solid Films*, 253, (1994),391-394.

Bhansali, S., et al., "Selective seeding of copper films on polyimide-patterned silicon substrate, using ion implantation", *Sensors and Actuators A: Physical*, 52(1), (Mar. 1996),126-131.

Braud, F., "Ultra Thin Diffusion Barriers for Cu Interconnections at The Gigabit Generation and Beyond", *VMIC Conference Proceedings*, (1996),174-179.

Cabrera, A. L., et al., "Oxidation protection for a variety of transition metals and copper via surface silicides formed with silane containing atmospheres", *Journal of Materials Research*, 6(1), (1991),71-79.

Chakravorty, K. K., et al., "High-Density Interconnection Using Photosensitive Polyimide and Electroplated Copper Conductor Lines",

*IEEE Transactions on Components, Hybrids, and Manufacturing Technology*, 13(1), (Mar. 1990),200-206.

Craig, J. D., "Polyimide Coatings", *Packaging, Electronic Materials Handbook*, vol. 1, ASM International Handbook Committee (eds.), ASM International, Materials Park, OH,(1989),767-772.

De Felipe, T. S., et al., "Electrical Stability and Microstructural Evolution in Thin Films of High Conductivity Copper Alloys", *Interconnect Technology*, 1999. *IEEE International Conference*, (May 24-26, 1999),293-295.

Ding, "Copper Barrier, Seed Layer and Planarization Technologies", *VMIC Conference Proceedings*, (1997),87-92.

Dubin, V. M., et al., "Selective and Blanket Electroless Copper Deposition for Ultralarge Scale Integration", *Journal of the Electrochemical Society*, 144(3), (1997),898-908.

Dushman, S., et al., *Scientific Foundations of Vacuum Technique*, 2nd Edition, John Wiley and Sons,(1962),1-806.

Edelstein, D., "Full Copper Wiring in a Sub-0.25 micrometer CMOS ULSI Technology", *Technical Digest., International Electron Devices Meeting*, (Dec. 7-10, 1997),773-776.

Eisenbraun, E. T., et al., "Selective and Blanket Low-Temperature Copper CVD for Multilevel Metallization in ULSI", *Conference Proceedings ULSI-VII*, (1992),5 pages.

Eldridge, J. M., "New Approaches for Investigating Corrosion in Thin Film Devices", *Electronic Packaging and Corrosion in Microelectronics, PRoceedings of ASM's Third Conference on Electric Packaging: Materials and Processes & Corrosion in Microelectronics*, Mpls, MN,(1987),283-285.

Ernst, et al., "Growth Model for Metal Films on Oxide Surface: Cu on ZnO(0001)—O", *Physical Review B*, 47, (May 15, 1993),13782-13796.

Fukuda, T., et al., "0.5 -micrometer-Pitch Copper-Dual-Damascene Metallization Using Organic SOG (k=2.9) for 0.18-micrometer CMOS Applications", *Electron Devices Meeting*, 1999. *IEDM Technical Digest. International*, (1999),619-622.

Gladlfelter, W. L., et al., "Trimethylamine Complexes of Alane as Precursors for the Low-Pressure Chemical Vapor Deposition of Aluminum", *Chemistry of Materials*, 1, (1989),pp. 339-343.

Godbey, D. J., et al., "Copper Diffusion in Organic Polymer Resists and Inter-level Dielectrics", *Thin Solid Films*, 308-309, (1997),pp. 470-474.

Grimblot, J., et al., "II. Oxidation of Aluminum Films", *Journal of the Electrochemical Society*, 129(10), (1982),2369-2372.

Hattangady, S. V., et al., "Integrated processing of silicon oxynitride films by combined plasma and rapid-thermal processing", *J. Vac. Sci. Technol. A*, 14(6), (1996),pp. 3017-3023.

Hirao, S., et al., "A Novel Copper Reflow Process Using Dual Wetting Layers", *1997 Symposium on VLSI Technology*, Digest of Technical Papers,(1997),57-58.

Hirata, A., et al., "WSiN Diffusion Barrier Formed by ECR Plasma Nitridation for Copper Damascene Interconnection", *16th Solid State Devices and Materials*, (1998),pp. 260-261.

Holloway, Karen, et al., "Tantalum as a diffusion barrier between copper and silicon", *Applied Physics Letters*, 57(17), (Oct. 1990),1736-1738.

Hu, C. K., et al., "Extendibility of Cu Damascene to 0.1 micrometer Wide Interconnections", *Mat. Res. Soc. Symp. Proc*, 514, (1998),pp. 287-292.

Hymes, S., et al., "Passivation of Copper by Silicide Formation in Dilute Silane", *Conference Proceedings ULSI-VII*, (1992),425-431.

Iijima, T., "Microstructure and Electrical Properties of Amorphous W—Si—N Barrier Layer for Cu Interconnections", *1996 VMIC Conference*, (1996),168-173.

Izaki, M., et al., "Characterization of Transparent Zinc Oxide Films Prepared by Electrochemical Reaction", *Journal of the Electrochemical Society*, 144, (Jun. 1997),1949-1952.

Jayaraj, K., "Low Dielectric Constant Microcellular Foams", *Proceedings from the Seventh Meeting of the DuPont Symposium on Polymides in Microelectrics*, (Sep. 1996),474-501.

Jeon, Y., et al., "Low-Temperature Fabrication of Polycrystalline Silicon Thin Films by ECR Pecvd", *The Electrochemical Society Proceedings*, 94(35), (1995),103-114.

Jin, C., et al., "Porous Xerogel Films as Ultra-low Permittivity Dielectrics for ULSI Interconnect Applications", *Conference Proceedings ULSI XII—1997 Materials Research Society*, (1997),463-469.

Kaloyeros, A. E., et al., "Blanket and Selective Copper CVD from Cu(FOD)2 for Multilivel Metallization", *Mat. Res. Soc. Symp. Proc.*, vol. 181,(1990),6 pages.

Kamins, T. I., "Structure and Properties of LPCVD Silicon Films", *J. Electrochem. Soc.: Solid-State Science and Technology*, 127, (Mar. 1980),pp. 686-690.

Kang, H. K., et al., "Grain Structure and Electromigration Properties of CVD CU Metallization", *Proceedings of the 10th International VLSI Multilevel Interconnection Conference*, (Jun. 8-9, 1993),223-229.

Keppner, H., et al., "The "Micromorph" Cell: A New Way to High-Efficiency-Low-Temperature Crystalline Silicon Thin-Film Cell Manufacturing", *Mat. Res. Soc. Symp. Proc.*, 452, (1997),pp. 865-876.

Kiang, M., et al., "Pd/Si plasma immersion ion implantation for selective electroless copper plating on Si02", *Applied Physics Letters*, 60(22), (Jun. 1, 1992),2767-2769.

Kirk, Raymond E., *Kirk-Othmer Concise Encyclopedia of Chemical Technology*, Grayson, M., (ed.), John Wiley & Sons, Inc., New York, NY,(1985),433-435, 926-938.

Kistiakowsky, G. B., et al., "Reactions of Nitrogen Atoms. I. Oxygen and Oxides of Nitrogen", *The Journal of Chemical Physics*, 27(5), (1957),pp. 1141-1149.

Klaus, J W., et al., "Atomic Layer Deposition of Tungsten Nitride Films Using Sequential Surface Reactions", *Journal of the Electrochemical Society*, vol. 147, No. 3, (Mar. 2000),1175-1181.

Laursen, T., "Encapsulation of Copper by Nitridation of Cu—Ti Alloy/Bilayer Structures", *International Conference on Metallurgical Coatings and Thin Films*, Abstract No. H1.03, San Diego, CA,(Apr. 1997),309.

Len, V., et al., "An investigation into the performance of diffusion barrier materials against copper diffusion using metal-oxide-semiconductor (MOS) capacitor structures", *Solid-State Electronics*, 43, (1999),pp. 1045-1049.

Lyman, T., et al., "Metallography, Structures and Phase Diagrams", *Metals Handbook*, 8, American Society for Metals, Metals Park, Ohio,(1989),pp. 300 & 302.

Marcadal, C., "OMCVD Copper Process for Dual Damascene Metallization", *VMIC Conference*, ISMIC,(1997),93-97.

Miller, R. D., "Low Dielectric Constant Polyimides and Polyimide Nanofoams", *Seventh Meeting of the DuPont Symposium on Polymides in Microelectronics*, (Sep. 1996),pp. 443-473.

Min, Jae-Sik, et al., "Metal-Organic Atomic-Layer Deposition of Titanium-Silicon-Nitride Films", *Applied Physics Letters*, 75(11), (Sep. 13, 1999),1521-1523.

Miyake, T., et al., "Atomic Hydrogen Enhanced Reflow of Copper", *Applied Physics Letters*, 70(10), (1997),1239-1241.

Murarka, S. P., et al., "Copper Interconnection Schemes: Elimination of The Need of Diffusion Barrier/Adhesion Promoter by the Use of Corrosion Resistant, Low Resistivity Doped Copper", *SPIE*, 2335, (1994),pp. 80-90.

Nakao, S., et al., "Thin and Low-Resistivity Tantalum Nitride Diffusion Barrier and Giant-Grain Copper Interconnects for Advanced ULSI Metallization", *Japanese Journal of Applied Physics*, 38(4B), (Apr. 1999),pp. 262-263.

Nayak, D.K., "High performance GeSi quantum-well PMOS on SIMOX", *International Electron Devices Meeting 1992. Technical Digest*, (1992),777-80.

Newboe, B., et al., "Applied Materials Announces First Barrier/Seed Layer System For Copper Interconnects", *Applied Materials*, http://www.appliedmaterials.com/newsroom/pr-00103.html,(1997),pp. 1-4.

Okamoto, Y., et al., "Magnetically Excited Plasma Oxynitridation of Si at Room Temperature", *Japanese Journal of Applied Physics*, 34, (1995),L955-957.

Palleau, J., et al., "Refractory Metal Encapsulation in Copper Wiring", *Advanced Metallization for Devices and Circuits-Science, Technology and Manufacturability, Materials Research Society Symposium Proceedings*, 337, (Apr. 1994),225-231.

Park, C. W., et al., "Activation Energy for Electromigration in Cu Films", *Applied Physics Letters*, 59(2), (Jul. 6, 1991),175-177.

Radzimski, Z. J., et al., "Directional Copper Deposition using d-c Magnetron Self-sputtering", *J. Vac. Sci. Technol. B*, 16(3), (1998),pp. 1102-1106.

Ramos, T , et al., "Nanoporous Silica for Dielectric Constant Less Than 2", *Conference Proceedings ULSI XII—1997 Materials Research Society*, (1997),455-461.

Rath, J. K., et al., "Low-Temperature deposition of polycrystalline silicon thin films by hot-wire CVD", *Solar Energy Materials and Solar Cells*, 48, (1997),pp. 269-277.

Ray, S. K., et al., "Flourine-enhanced nitridation of silicon at low temperatures in a microwave plasma", *J. Appl. Phys.*, 70(3), (1991),pp. 1874-1876.

Rossnagel, S. M., "Magnetron Sputter Deposition of Interconnect Applications", *Conference Proceedings, ULSI XI*, (1996),227-232.

Rossnagel, S. M., et al., "Metal ion deposition from ionized mangetron sputtering discharge", *J. Vac. Sci. Technol. B*, 12(1), (1994),pp. 449-453.

Ryan, J. G., "Copper Interconnects for Advanced Logic and DRAM", Extended Abstracts of the 1998 International Conference on Solid-State Devices and Materials, Hiroshima,(1998),pp. 258-259.

Ryu, Changsup , "Barriers for Copper Interconnections", *Solid State Technology*, 42(4), (Apr. 1999),pp. 1-3.

Ryu, C. , et al., "Barriers for copper interconnections", *Solid State Technology*, (Apr. 1999),pp. 53,54,56.

Saarivirta, M. J., "High Conductivity Copper Rich Cu—Zr Alloys", *Transactions of the Metallurgical Society of AIME*, 218, (1960),431-437.

Senzaki, Y. , "Chemical Vapor Deposition of Copper using a New Liquid Precursor with Improved Thermal Stability", *Conference Proceedings ULSI XIII, Materials Research Society*, (1998),pp. 451-455.

Shacham-Diamand, Y. , "100 nm Wide Copper Lines Made by Selective Electroless Deposition", *Journal of Micromechanics and Microengineering*, 1, (Mar. 1991),66-72.

Shacham-Diamand, Yosi , et al., "Copper electroless deposition technology for ultra-large-scale-intergration (ULSI) metallization", *Microelectronic Engineering*, NL, vol. 33, No. 1, XP004054497, (1997),47-58.

Srivatsa, A. R., et al., "Jet Vapor Deposition: an Alternative to Electrodeposition", *Surface Engineering*, 11, (1995),75-77.

Stroud, P. T., et al., "Preferential deposition of silver induced by low energy gold ion implantation", *Thin Solid Films*, Switzerland, vol. 9, No. 2, XP000993098, (Feb. 1972),273-281.

Tao, J. , et al., "Electromigration Characteristics of Copper Interconnects", *IEEE Electron Devices Letters*, 14(5), (May 1993),249-251.

Ting, C. H., "Methods and Needs for Low K Material Research", *Materials Research Society Symposium Proceedings*, vol. 381, Low-Dielectric Constant Materials—Synthesis and Applications in Microelectronics, Lu, T.M., et al., (eds.), San Francisco, CA,(Apr. 17-19, 1995),3-17.

Tsukada, T. , et al., "Adhesion of copper films on ABS polymers deposited in an internal magnet magnetron sputtering system", *J. Vac. Sci. Technol.*, 16(2), (1979),348-351.

Van Vlack, Lawrence H., "Elements of Materials Science", *Addison-Wesley Publishing Co., Inc.* Reading, MA, (1959),468.

Venkatesan, S. , et al., "A High Performance 1.8V, 0.20 micrometer CMOS Technology with Copper Metalization", *Electron Devices Meeting, 1997. Technical Digest., International*, (Dec. 7-10, 1997),769-772.

Vossen, J. L., et al., *Thin Film Processes II*, Academic Press, Inc. ,(1991),1-866.

Wang, X. W., et al., "Highly Reliable Silicon Nitride Thin Films Made by Jet Vapor Deposition", *Japanese Journal of Applied Physics*, vol. 34, Part1, No. 2B, (Feb. 1995),955-958.

Wang, K. , et al., "Very Low Temperature Deposition of Polycrystalline Silicon Films with Micro-Meter-Order Grains on SiO2", *Mat. Res. Soc. Symp. Proc.*, 355, (1995),pp. 581-586.

Winters, H. F., et al., "Influence of Surface Absorption Characteristics on Reactivity Sputtered Films Grown in the Biased and Unbiased Modes", *J. Appl. Phys.*, 43(3), (1972),pp. 794-799.

Wolf, S. , et al., *Silicon Processing for the VLSI Era*, vol. 1—*Process Technology*, Lattice Press, Sunset Beach, CA,(1986),514-538.

Yeh, J. L., et al., "Selective Copper plating of Polysilicon Surface Micromachined Structures", *Solid-State Sensor and Actuator Workshop*, (1998),pp. 248-251.

Zhang, J. , et al., "Investigations of photo-induced decomposition of palladium acetate for electroless copper plating", *Thin Solid Films*, 318, (1998),pp. 234-238.

* cited by examiner

ELECTRONIC APPARATUS HAVING A CORE CONDUCTIVE STRUCTURE WITHIN AN INSULATING LAYER

CROSS REFERENCE TO RELATED APPLICATIONS

The present application is a divisional of U.S. Ser. No. 10/634,274, filed on 5 Aug. 2003, now U.S. Pat. No. 7,220,665, which is herein incorporated by reference in its entirety.

This application is related to commonly assigned U.S. Ser. No. 10/414,147, filed on 15 Apr. 2003, now U.S. Pat. No. 6,740,392, entitled "Improved Surface Barriers for Copper and Silver Interconnections Produced by a Damascene Process," which is hereby incorporated by reference in its entirety.

TECHNICAL FIELD

This application relates generally to semiconductor devices and device fabrication, and more specifically to fabricating metals in a damascene structure.

BACKGROUND

One of the main problems confronting the semiconductor processing industry, in the ULSI age, is that of capacitive-resistance loss in the wiring levels. This has led to a large effort to reduce the resistance of and lower the capacitive loading on wiring levels. Since its beginning, the industry has relied on aluminum and aluminum alloys for wiring. In a like manner, the industry has mainly relied on $SiO_2$ as the insulator of choice, although polyimide was used in a number of products by IBM, for a number of years. The capacitive resistance problem grows with each succeeding generation of technology.

To improve the conductivity, it has been suggested to substitute copper, silver or gold metallurgy for the aluminum metallurgy now being used. Several potential problems have been encountered in the development of these proposed metallurgies. One problem is the fast diffusion of copper through both silicon and $SiO_2$. This problem, along with the known junction poising effects of copper and gold, have led to proposals to use a liner to separate these metallurgies from an $SiO_2$ insulator. These approaches, however, do not fully resolve problems associated with decreasing minimum line size and decreasing liner size. The combination of the shrinking line size in the metal line and the decreasing liner size increases both the capacitance and resistance.

With respect to capacitive loading effects, studies have been conducted that considered employing various polymers such as fluorinated polyimides as possible substitutions for $SiO_2$ insulators. Several of these materials have dielectric constants considerably lower than $SiO_2$. However, as in the case of $SiO_2$, an incompatibility problem with copper metallurgy has been found. In the case of polyimide, and many other polymers, it has been found that the polymer, during curing, reacts with copper during the curing process, forming a conductive oxide $CuO_2$, which is dispersed within the polymer. See, D. J. Godbey et al., *International Conference on Metallurgical Coatings and Thin Films*, San Diego, Calif. Abstract H2.04, pg. 313 (Apr. 21-25, 1997). This conductive oxide then raises the effective dielectric constant of the polymer and in many cases increases the polymers conductivity.

Various approaches using copper and other metals in $SiO_2$ and polymer insulators have been implemented to improve the properties of the electrical interconnects. However, these electrical characteristics are impaired when an oxide is formed at or near the surface of the electrical interconnect. Thus, structures and methods are needed which alleviate the problems associated with via and metal line fabrication processes.

DETAILED DESCRIPTION

Figure 1A:
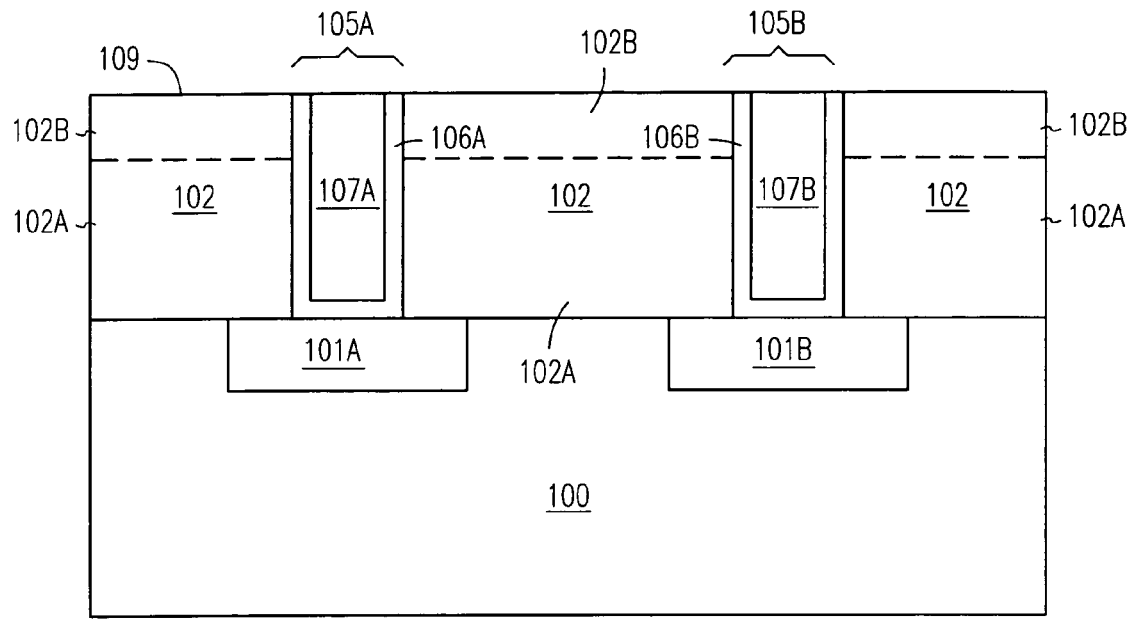
FIGS. 1A-1H illustrate elements for an embodiment of a process to form metallizations, according to various embodiments of the present invention.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments disclosed herein are not necessarily mutually exclusive, as some disclosed embodiments can be combined with one or more other disclosed embodiments to form new embodiments.

The terms wafer and substrate used in the following description include any structure having an exposed surface with which to form an integrated circuit (IC). The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

In various embodiments, an electronic device using layered metallizations in a wiring structure is produced by a method that includes forming within an insulator a conductive structure having a core conductor layer on a first conducting layer and a capping adhesion and/or barrier (adhesion/barrier) layer on the core conductor layer, where the capping adhesion/barrier layer is formed on the core conductor layer after subjecting the core conductor layer to a $H_2$ plasma treatment. Subjecting the core conductor layer to a $H_2$ plasma treatment prior to forming the capping adhesion/barrier layer provides an interface between the core conductor and the capping adhesion/barrier that is substantially free of an oxide. As a result, the conductive structure can provide improved metallizations for an integrated circuit in which the surface of the metallization layer is substantially free of an oxide or sub-oxide. In an embodiment, the first conducting layer includes an adhesion/barrier layer and a seed layer. In a further embodiment, the structure produced may be an air bridge. In an embodiment, the insulator is a polyimide layer. In another embodiment, the insulator is an oxide layer. In an embodiment, the core conducting layer is a copper layer.

The use of a copper conductor along with a barrier/liner layer provides significant improvement in conductivity over a Ti/AlCu/Ti sandwich structure now in widespread use in the microelectronics industry. However, as the line width decreases even a thin liner has a significant effect on the composite line resistance. As minimum dimensions shrink, the use of even a twenty angstrom layer of an alloy with higher resistivity will have a significant effect on the total resistivity of the conductor composite. See, P. C. Andricacos, *The Electrochemical Society Interface*, pp. 32-37, (Spring 1999).

It has also been shown that there is a significant difference between the amount of copper oxide that is formed when a polyimide insulator is used if the acidity of the polymer solution is low, i.e., if the precursor used in the formation of the polyimide is an ester instead of an acid. In the case of PI-2701, which is a photosensitive polyimide that starts from an ester precursor, the amount of oxide formed is reduced by a factor of approximately four as compared to films with a similar final chemistry, prepared from an acid precursor. It is thought that the slight acidity of PI-2701 may come from the photo-pac or the process used to form it.

The use of Ti as a barrier layer was found to increase the resistivity of a Cu film significantly when heat-treated at temperatures of 350° C. or above. However, if the heat-treatment was carried out in hydrogen no increase in resistivity was reported. As this temperature is above the eutectoid temperature of the TiH system, the formation of TiH is assumed to have occurred. A similar increase in resistivity was reported to occur with Zr-containing and Hf-containing copper alloys. See, S. P. Muraka et al., *SPIE*, vol. 2335, pp. 80-90. From the equilibrium phase diagrams of the Cu—Ti and Cu—Zr systems, it can be seen that the solubility of Zr in Cu is more than ten times less than that of Ti.

In addition to copper, gold and silver also offer lower resistivities than aluminum. These materials also have a significantly lower adhesion to oxides than aluminum. These materials as well as aluminum have relatively poor adhesion to polymers. Processes that offer significant improvements to the barrier adhesion art for the bottom and the sidewall damascene or dual damascene structures are provided by the present inventor in U.S. Pat. No. 6,376,370 issued 23 Apr. 2002, U.S. Pat. No. 6,420,262 issued 30 Jul. 2002, U.S. Pat. No. 6,426,289 issued 16 Jul. 2002, and U.S. Pat. No. 6,740,392 issued 25 May 2004, which are hereby incorporated by reference.

An embodiment for a method for forming an electronic device includes forming a first conductive layer in an opening in a multilayer dielectric structure supported by a substrate, forming a core conductive layer on the first conductive layer, subjecting the core conductive layer to a $H_2$ plasma treatment, and depositing a capping adhesion/barrier layer on the core conductive layer after the $H_2$ plasma treatment. In an embodiment, the multilayer dielectric structure provides an insulating layer around the core conducting layer and at least one sacrificial layer for processing. The $H_2$ plasma treatment removes unwanted oxide from the surface region of the core conducting layer such that the interface between the core conducting layer and the capping adhesion/barrier is substantially free of oxides. In an embodiment, the core conducting layer is copper with a titanium nitride or zirconium capping adhesion/barrier layer.

In various embodiments according to the teachings of the present invention, the formation of a capping adhesion/barrier layer on the top surface of a damascene metal is preceded by subjecting the top surface of the damascene metal to a $H_2$ plasma treatment. This eliminates or substantially reduces the probability of forming an oxide or sub-oxide on the top surface of the core conductor of the damascene metal between the time that the core conductor is deposited and the time that the capping adhesion/barrier layer is formed. The formation of such an oxide or sub-oxide would decrease the adhesion of the top barrier to the underlying metallurgy, and also increase the resistivity of the interface.

In embodiments according to the present invention, methods in a damascene process provide for eliminating or substantially reducing top layer oxides or sub-oxides without increasing a capping adhesion/barrier thickness. Prior to the deposition of the capping adhesion/barrier, a $H_2$-containing plasma is used to reduce the metal oxides on the top surface. The plasma treatment may either be performed in the deposition chamber in which the capping adhesion/barrier layer is formed or in a separate chamber of a multi-chamber deposition system. In an embodiment, conductive material is deposited to form a capping adhesion/barrier layer by a low energy ion implant. The ion implant energy employed provides depositing the bulk of the implanted material in the top few atomic layers. The resulting structure can be exposed to a nitrogen-containing plasma or to an elevated temperature nitrogen treatment, forming a conducting nitride layer on the metal surfaces.

FIGS. 1A-1H illustrate elements for an embodiment of a process to form metallizations for an electronic device at various processing stages. FIG. 1A illustrates a portion of an integrated circuit structure, namely an integrated circuit having a number of semiconductor devices formed in a substrate. FIG. 1A further illustrates the structure after a device structure is formed in the substrate and the contact structure to the device structure is in place. One of ordinary skill in the art will understand upon reading this disclosure the manner in which a number of semiconductor structures, e.g. transistors, can be formed in a substrate. For example, FIG. 1A illustrates the structure after a number of device structures, e.g. transistor 101A and 101B are formed in the substrate 100. An insulator layer 102 is deposited over the number of semiconductors 101A and 101B. In an embodiment, insulator layer 102 includes a field oxide 102A and a layer 102B of $Si_3N_4$. In an embodiment, insulator layer 102 includes a layer of $Si_3N_4$ having a thickness of about 100 Angstroms (Å). This insulator layer will also serve as an additional barrier to impurities coming from subsequent processing steps.

Contact holes 105A and 105B are opened to the number of device structures 101A and 101B using a techniques that are known to those skilled in the art. In an embodiment, TiN layers 106A, 106B are deposited followed by deposition of tungsten layers 107A, 107B by a process such as chemical vapor deposition (CVD) to form contact plugs. Other conducting materials may be used. Excess tungsten and TiN are removed from the $Si_3N_4$ surface by chemical mechanical planarization (CMP) or other suitable processes to form a planarized surface 109.

Figure 1B:
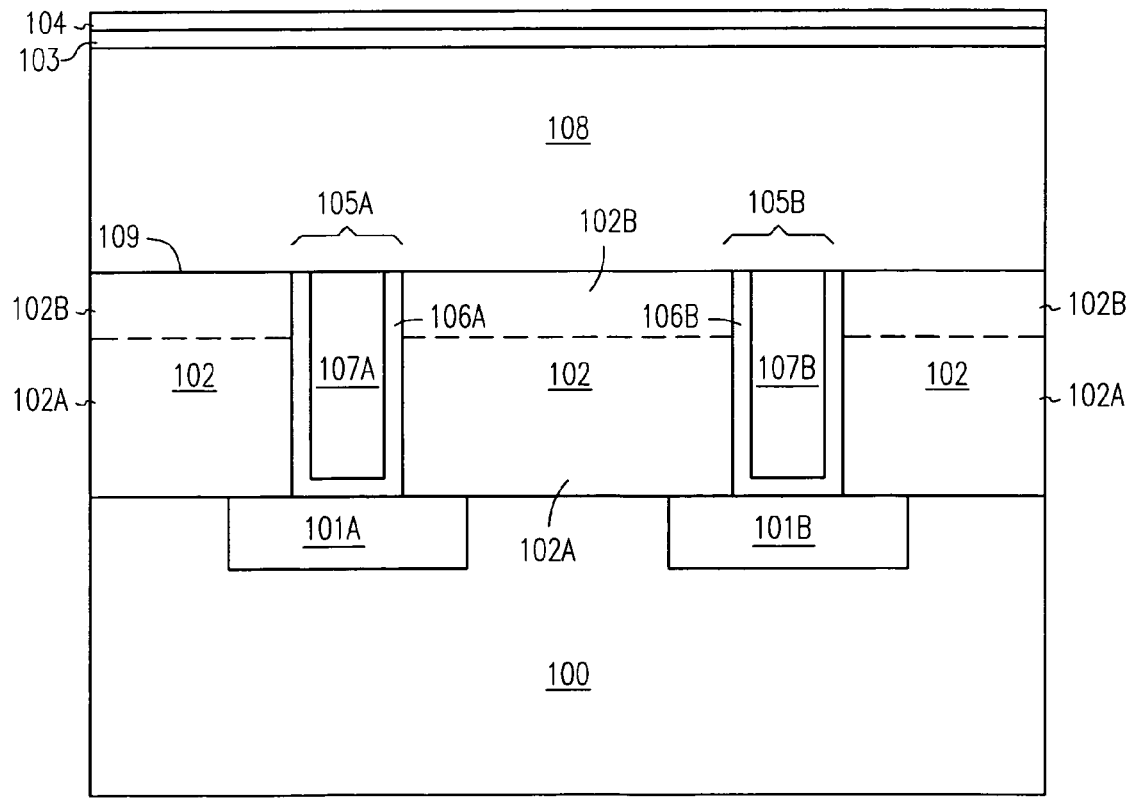
Figure 1C:
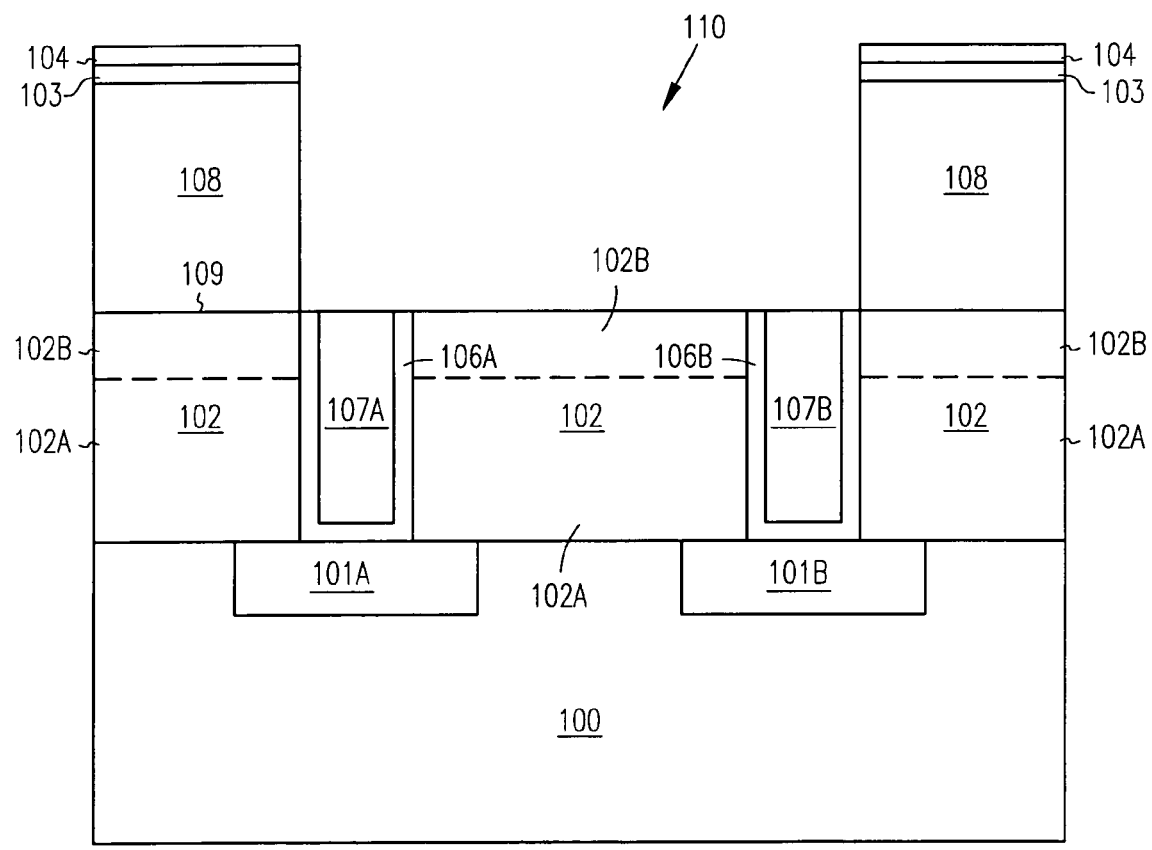

As shown in FIG. 1B, a multilayer dielectric structure having a lower insulator layer 108, an intermediate dielectric layer 103, and a top dielectric layer 104 is deposited over the wafer surface. In an embodiment, each layer 108, 103, 104 is deposited independently over the wafer surface. Lower insulator 108 will provide the insulating layer in which a conducting structure will be formed, while intermediate dielectric layer 103 and top dielectric 104 provide sacrificial layers for the fabrication process. In an embodiment, lower insulator layer 108 is deposited over the $Si_3N_4$ layer 102B and the contact plugs formed in vias 105A, 105B. Lower insulator layer 108 is deposited with a thickness equal to the wiring at that level.

In an embodiment, lower insulator layer 108 is a polymer, a fluorinated polymer, or a foamed polymer. A polymer layer 108 can be deposited using, for example, the process and material disclosed in U.S. Pat. No. 6,284,656 issued 4 Sep. 2001, hereby incorporated by reference. Following deposition of a polymer, it is cured. In an embodiment, lower insulator layer 108 includes a polyimide layer, a fluorinated polyimide layer, or a foamed polyimide layer. In an embodiment, lower insulator 108 is a polyimide layer applied to surface 109 such that when cured it will have sufficient thickness to equal the thickness for a first wiring level. Polyimide layer 108 may be converted to a foamed polyimide by a method, for example, that uses a supercritical fluid as described in U.S. Pat. No. 6,077,792 issued 20 Jun. 2000, hereby incorporated by reference.

In an embodiment, a low temperature oxide is deposited as intermediate layer 103 having a thickness of about 500 Å. A layer of $Si_3N_4$ having a thickness of about 500 Å is deposited as top dielectric 104 on intermediate layer 103. Other thicknesses may be used. A thin layer of resist is applied to top dielectric layer 104. The required damascene images are etched in the oxide layer 103 and the nitride layer 104. To define trenches in polyimide layer 108, an $O_2$ reactive ion etching (RIE) process is used, which also removes the thin resist layer. Thus polyimide layer 108, or lower insulator 108, is patterned to define a trench 110, or a number of trenches, in the lower insulator layer 108 providing an opening to first level vias, 107A and 107B, or a number of vias, in planarized surface 109. The structure is now as appears in FIG. 1C.

Figure 1D:
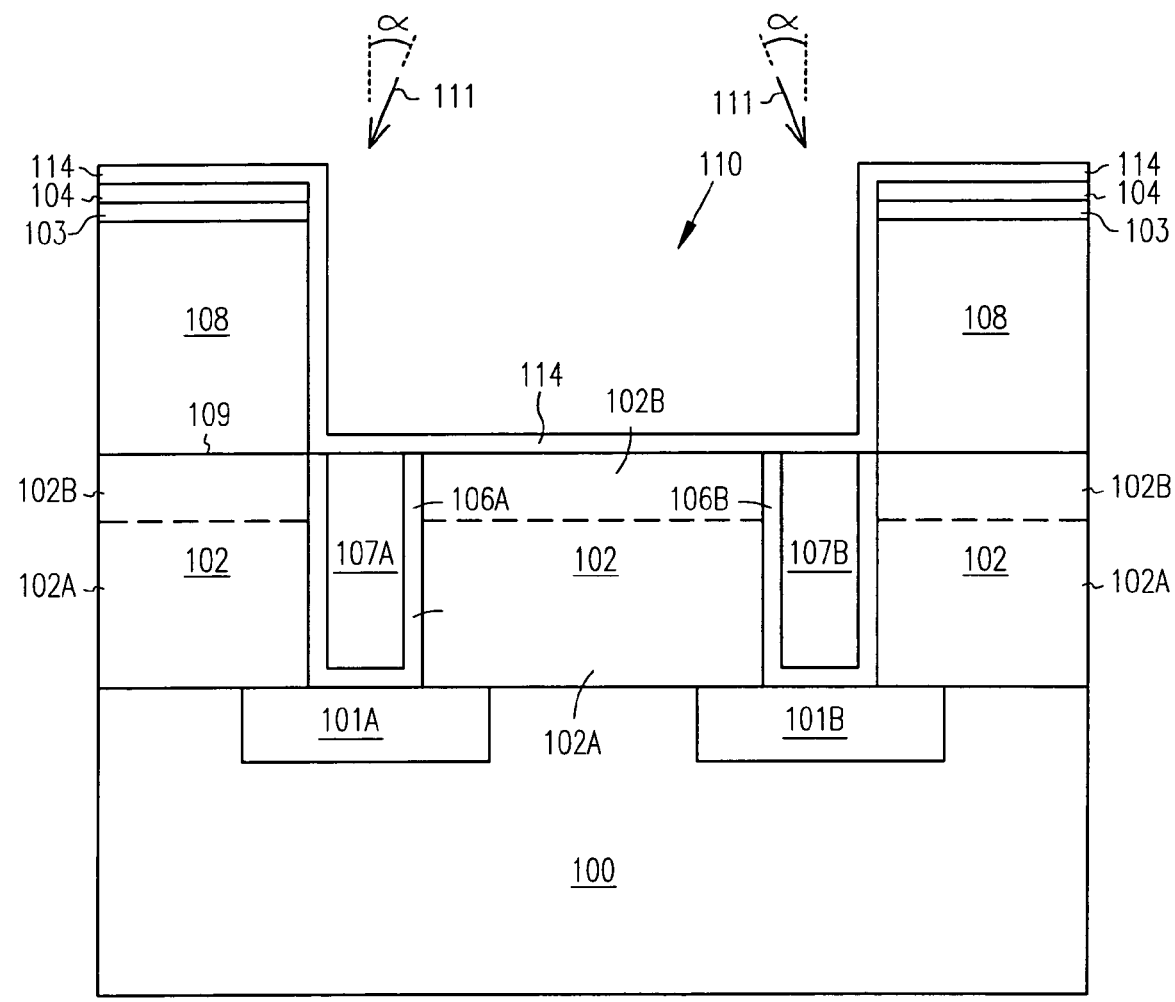

As shown in FIG. 1D, an adhesion/barrier layer 114 is deposited in trench 110, or the number of trenches, using a low energy ion implantation. In an embodiment, adhesion/barrier layer is formed by another method such as by CVD. In an embodiment, adhesion/barrier layer 114 includes a layer of zirconium having a thickness of approximately 5 to 100 Å. In alternate embodiments, adhesion/barrier layer 114 includes a layer of titanium and/or hafnium. In one embodiment, layer 114 of zirconium has a thickness of approximately 50 Å. This can be achieved using a $10^{17}$ ion implant of zirconium, i.e. $10^{17}$ ions of zirconium per square centimeter (cm$^2$). In an embodiment, the layer of zirconium 114 is implanted at 100 electron volts (eV) into the surface of the trenches 110 in polymer layer 108 using a varying angle implant ($\alpha$), as represented by arrows 111, where the angle of implantation is changed from normal to the wafer surface to 15 degrees off normal. As one of ordinary skill in the art will understand upon reading this disclosure, using a varying angle implant, where an angle of implantation is changed from normal to planarized surface 109 to approximately 15 degrees off normal, deposits adhesion/barrier layer 114 on all surfaces in trench 110, or in the number of trenches. Also, in forming adhesion/barrier layer 114, various refractory metals can be employed, such as tantalum, tungsten, molybdenum, hafnium, niobium, rhenium, osmium, ruthenium, zirconium, titanium, vanadium, chromium and manganese. In various embodiments, alloys of Ta or W with N or with certain polyimides, in particular, those formed from the ester of Zr, TI or Hf, are employed. The structure is now as appears in FIG. 1D.

Figure 1E:
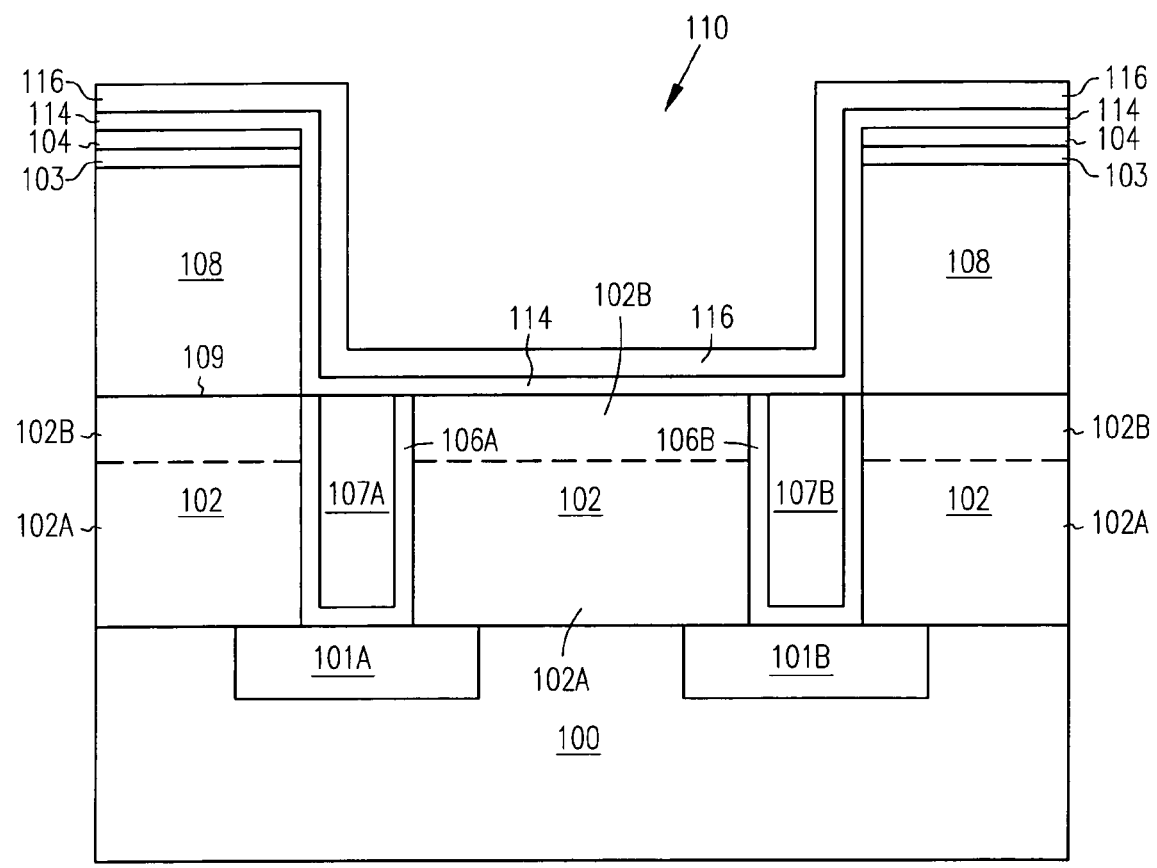

In FIG. 1E, a seed layer 116 is deposited on adhesion/barrier layer 114. In an embodiment, seed layer is deposited using a low energy ion implantation at energies ranging from 100 electron volts (eV) to 2000 electron volts (eV). In another embodiment, seed layer is deposited by CVD. In various embodiments, seed layer 116 on adhesion/barrier layer 114 includes a layer of aluminum, copper, silver, or gold. Seed layer 116 serves as a catalyst or base metal for subsequent electroless plating or electroplating of a core conducting layer and as an adhesion layer preventing delamination of subsequently electrolessly deposited or electroplated metal. In various embodiments, seed layer 116 includes a layer of one or more refractory metals such as tantalum, tungsten, molybdenum, hafnium, niobium, rhenium, osmium, ruthenium, zirconium, titanium, vanadium, chromium and manganese. In an embodiment, a copper seed layer is utilized for a core conducting layer of copper. In an embodiment, seed layer 116 includes a layer of copper having a thickness of approximately a 100 Å. This can be achieved using an $8 \times 10^{16}$ ion implant of copper using a low energy ion implantation. The resulting structure is shown in FIG. 1E.

Figure 1F:
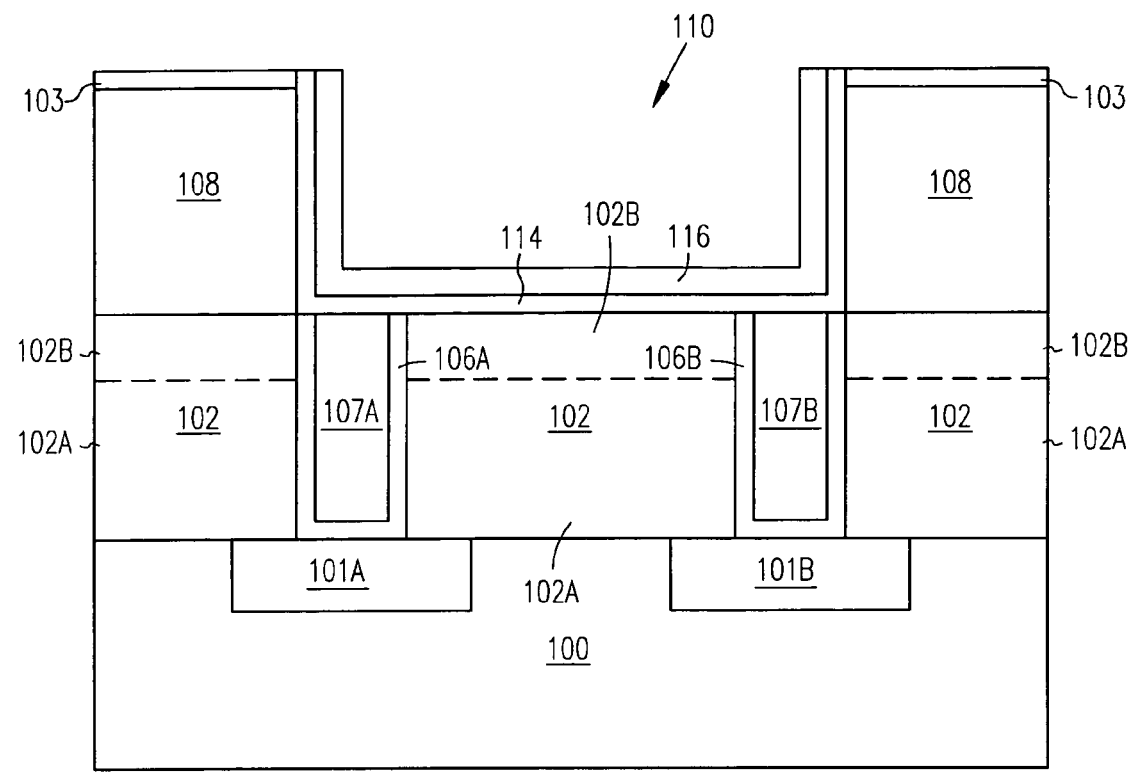

After seed layer 116 is deposited, $Si_3N_4$ layer 104 is removed using a selective etch. An etchant is selected that negligibly attacks polyimide layer 108 and oxide layer 103. The selective etch also removes seed layer 116 and adhesion/barrier layer 114 from all areas except in the trench 110. Alternately, seed layer 116 and adhesion/barrier layer 114 along with silicon nitride layer 104 may be removed from the surface by a chemical mechanical planarization (CMP) process stopping on the oxide layer 103. The structure is now as shown in FIG. 1F.

Figure 1G:
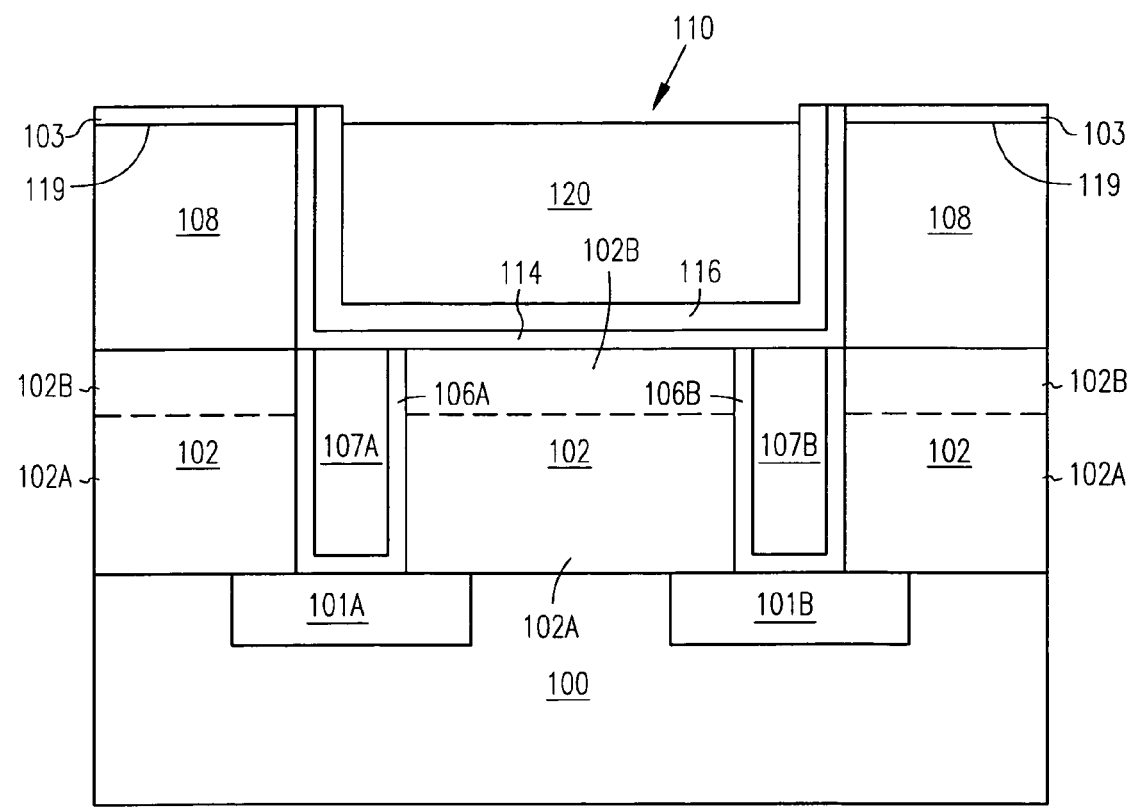

In FIG. 1G, a core conducting layer 120, or a number of first level metal lines 120, is deposited over the seed layer 116 in trench 110, or in a number of trenches. Core conducting layer, or number of first level metal lines 120, is a layer substantially of aluminum, copper, silver, or gold depending on the type of seed layer 116 deposited. Core conducting layer 120 is electrolessly plated into trench 110 on seed layer 116 to a thickness which causes core conducting layer 120 to extend to about the level of a top surface 119 of polyimide layer 108. Electroless metal deposition is attractive due to low processing costs and high quality metal deposits. In addition, equipment for performing electroless metal deposition is relatively inexpensive compared to other semiconductor processing equipment for depositing metals. Electroless deposition also provides for batch processing wafers, thereby further reducing cost and increasing production throughput. In an embodiment, copper is electroless plated onto seed layer 116. In an embodiment, forming conductive layer 120 includes electroless plating copper in an ambient air environment. Electroless copper plating is used to deposit sufficient copper to fill trench 110, or a number of trenches, to top surface 119 of polyimide insulator layer 108.

Core conducting layer 120 is subjected to a $H_2$ plasma treatment. This removes unwanted oxide from the surface of core conducting layer 120. With respect to FIG. 1H, the surface of core conducting layer 120 is then implanted with material to form a capping adhesion/barrier layer 122 to prevent metal contamination. In various embodiments, the capping is a material such as aluminum, boron, chromium, molybdenum, tungsten, titanium, zirconium, hafnium, magnesium, vanadium, columbium, or tantalum or oxides or nitrides of these elements. In an embodiment, core conducting layer is copper and the dopant is zirconium. The zirconium is implanted at an energy level of about 0.125 keV to 2.0 keV and at a concentration of about $1.25 \times 10^{16}$ ions/cm$^2$ to about $2.0 \times 10^{17}$ ions/cm$^2$. In an embodiment, the zirconium is implanted at an energy of about 0.5 keV and at a concentration of about $5 \times 10^{16}$ ions/cm$^2$. In other embodiments using other dopants, the implant energy and the concentration can range from about 0.125 to about 2.0 keV and from about $1.25 \times 10^{16}$ to about $2 \times 10^{17}$ ions/cm$^2$, respectively. In an embodiment, capping adhesion/barrier layer ranges from about 5 Å to about 40 Å thick. In an embodiment, capping adhesion/barrier layer is around 20 Å thick.

Figure 1H:
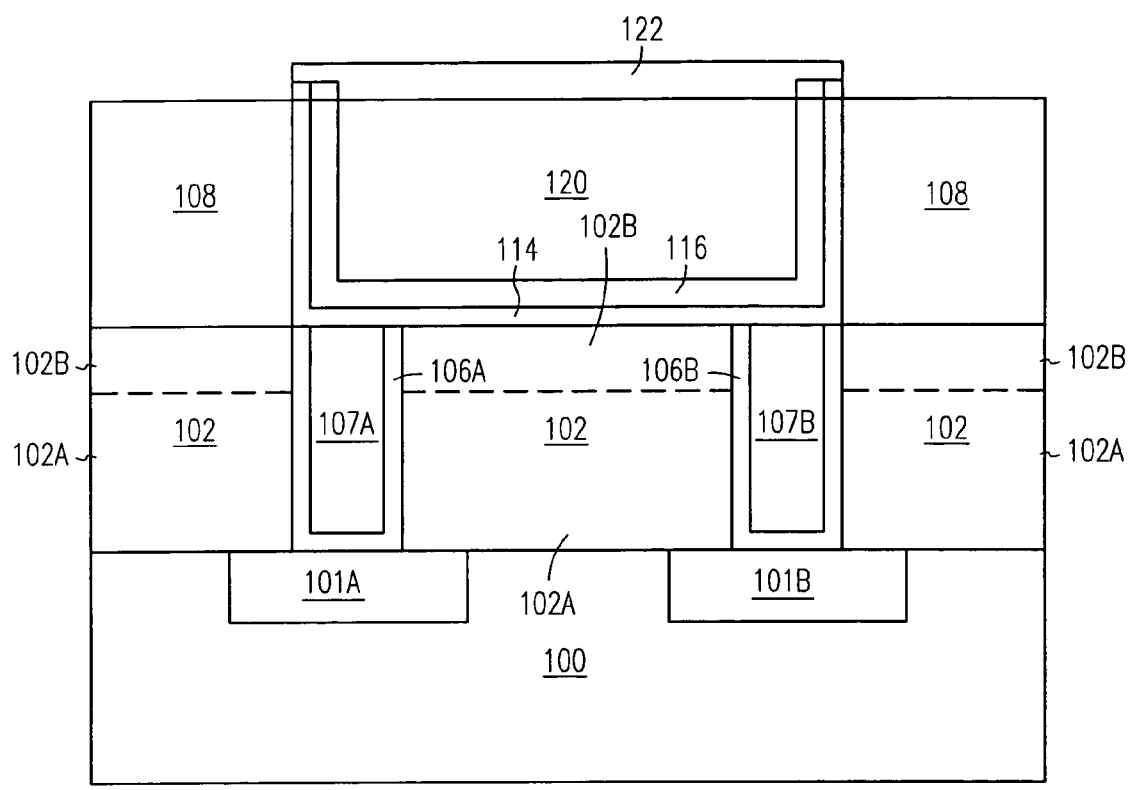

Oxide layer 103 is removed by a etch which attacks oxide but has no or negligible effect on polyimide. This removes the capping layer from all areas except on core conducting layer 120. In an embodiment, this etch removes zirconium from all areas except from capping adhesion/barrier layer 122 on copper core conducting layer 120. The resulting capping adhesion/barrier layer 122 can be utilized in an interconnect system for an integrated circuit coupling passive and/or active components such as capacitors, transistors and various memory devices. The resulting structure is shown in FIG. 1H.

The formation of the metallization structure as discussed with respect to FIGS. 1A-1H describes a single damascene structure, other implementations using dual damascene can be constructed using appropriate masking steps. The process is then repeated as many times as necessary to build the multi-level wiring layers desired. Depending upon the temperatures used in the processes for applying and curing the polymers as well as depositing the resist stack, a final post processing heat-treatment of about 250° C. to about 350° C. for about one hour to about two hours may be used to reduce the resistivity of the conductors in the wiring structure. If an air bridge structure is desired all or a portion of the polymer insulation can be removed by subjecting the completed structure, or a portion thereof, to an oxygen plasma treatment.

Figure 2A:
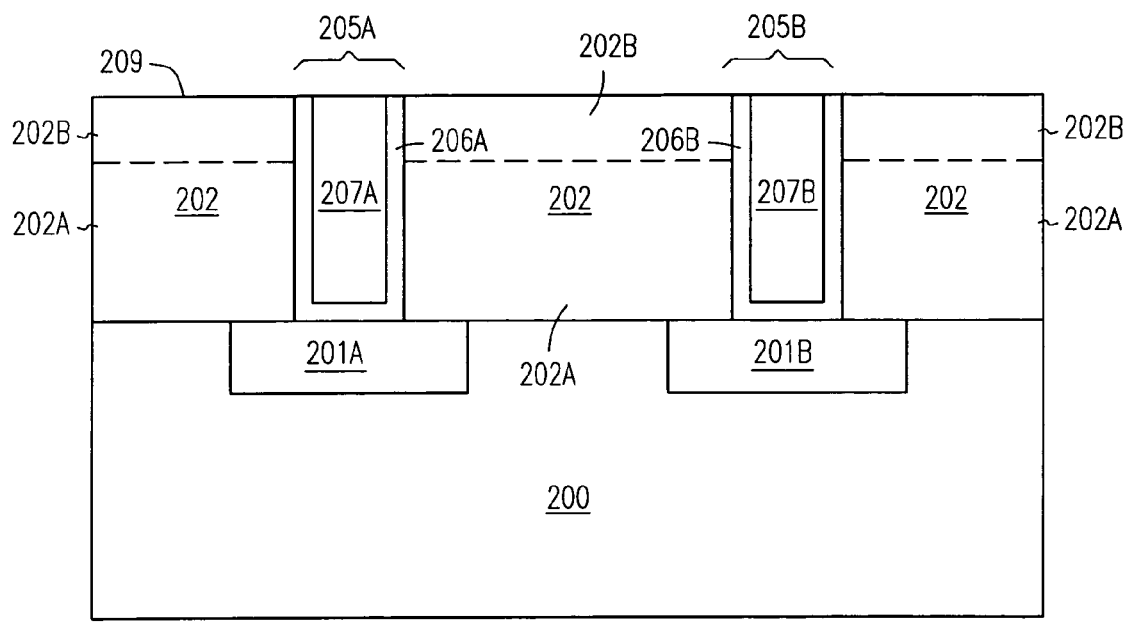
FIGS. 2A-2I illustrate elements for another embodiment of a process to form metallizations, according to various embodiments of the present invention.

FIGS. 2A-2I illustrate elements for another embodiment of a process to form metallizations for an electronic device at various processing stages. FIG. 2A illustrates a portion of an integrated circuit structure, namely an integrated circuit having a number of semiconductor devices formed in a substrate. FIG. 2A further illustrates the structure after a device structure is formed in the substrate and the contact structure to the device structure is in place. For example, FIG. 2A illustrates the structure after a number of device structures, e.g. transistor 201A and 201B are formed in the substrate 200. An insulator layer 202 is deposited over the number of semiconductors 201A and 201B. In an embodiment, insulator layer 202 includes a field oxide 202A and a layer 202B of $Si_3N_4$. $Si_3N_4$ layer 202B may be formed on or below field oxide 202A. In an embodiment, insulator layer 202 includes a layer of $Si_3N_4$ having a thickness of about 100 Å. This insulator layer will also serve as an additional barrier to impurities coming from subsequent processing steps.

Contact holes 205A and 205B are opened to the number of device structures 201A and 201B using a techniques that are known to those skilled in the art. In an embodiment, TiN layers 206A, 206B are deposited followed by deposition of tungsten layers 207A, 207B by a process such as chemical vapor deposition (CVD) to form contact plugs. Other metals may be employed to form contact plugs. Excess tungsten and TiN are removed from the $Si_3N_4$ surface by chemical mechanical planarization or other suitable processes to form a planarized surface 209.

Figure 2B:
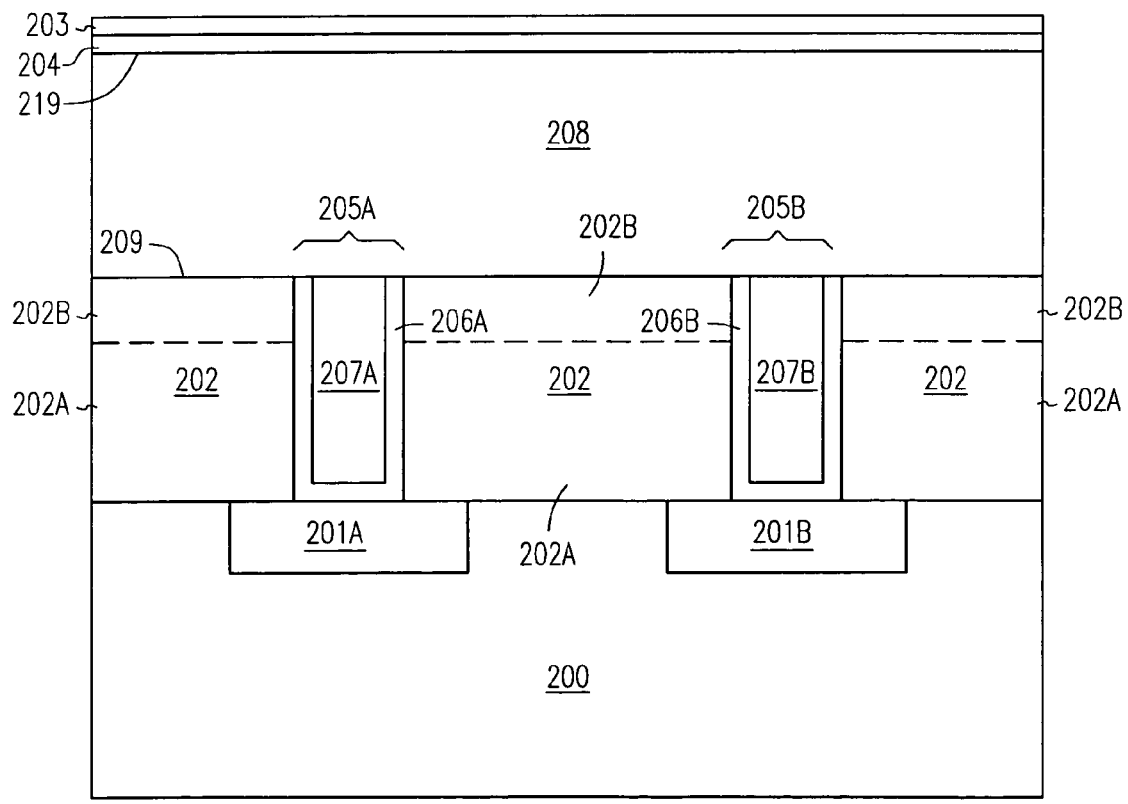
Figure 2C:
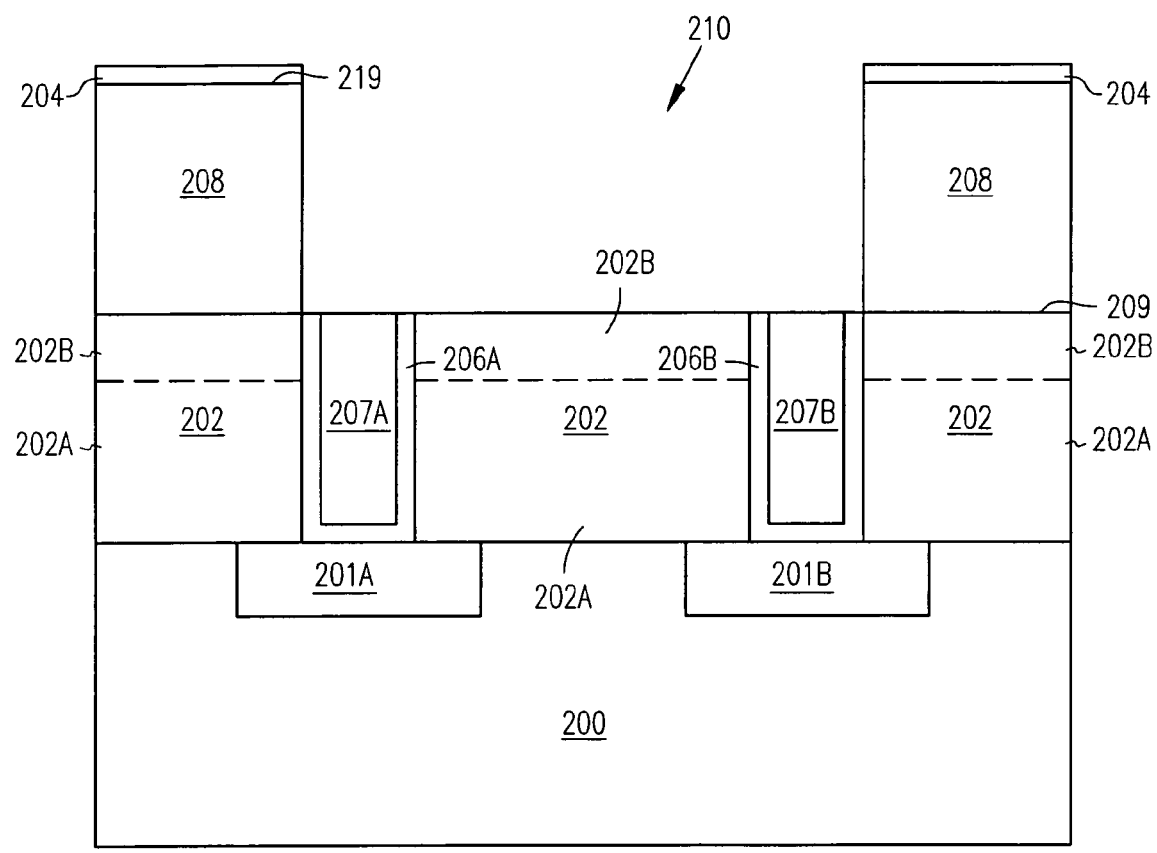

As shown in FIG. 2B, a multilayer dielectric structure having a lower insulator layer 208 and a top dielectric layer 204 is deposited over the wafer surface. In an embodiment, each layer 208, 204 is deposited independently over the wafer surface. Lower insulator 208 will provide the insulating layer in which a conducting structure will be formed, while top dielectric 204 provides a sacrificial layer for the fabrication process. In an embodiment, lower insulator layer 208 is deposited over the $Si_3N_4$ layer 202B and the contact plugs formed in vias 205A, 205B. Lower insulator layer 208 is deposited with a thickness equal to the wiring at that level.

In an embodiment, lower insulator layer 208 is a oxide, a fluorinated oxide, or an aerogel. In an embodiment, lower insulator layer 208 is a silicon oxide layer. In an embodiment, lower insulator layer 208 is a silicon dioxide layer. Referring to FIG. 2B, lower insulator layer 208 having a top surface 219 is deposited with a thickness equal to the wiring at that level. In an embodiment, a layer of $Si_3N_4$ having a thickness of about 500 Å is deposited as top dielectric 204 on lower insulator layer 208. Other thicknesses may be used. A thin layer 203 of resist is applied to $Si_3N_4$ layer 204.

The required damascene images are etched in the resist 203 and the nitride layer 204. To define trenches in oxide layer 208, an oxide etch is used, which also removes the remaining resist layer. Thus oxide layer 208, or lower insulator 208, is patterned to define a trench 210, or a number of trenches, in the oxide layer 208 providing an opening to first level vias, 207A and 207B, or a number of vias, in planarized surface 209. The structure is now as appears in FIG. 2C.

Figure 2D:
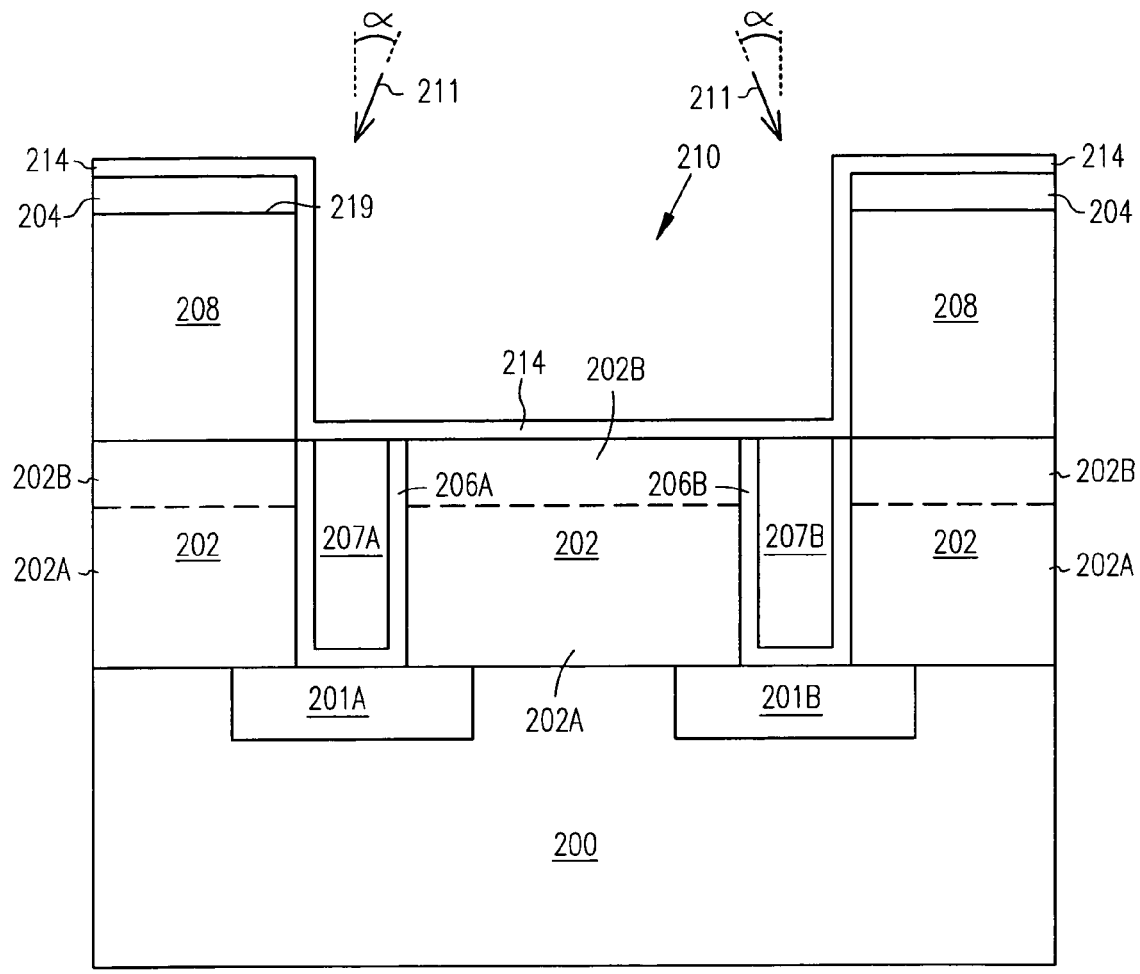

As shown in FIG. 2D, an adhesion/barrier layer 214 is deposited in trench 210, or in the number of trenches, using a low energy ion implantation. In an alternate embodiment, adhesion/barrier layer is formed by another method such as by CVD. In an embodiment, adhesion/barrier layer 214 includes a layer of zirconium having a thickness of approximately 5 to 100 Å. In alternate embodiments, adhesion/barrier layer 214 includes a layer of titanium and/or hafnium. In one embodiment, layer 214 of zirconium has a thickness of approximately 50 Å. This can be achieved using a $10^{17}$ ion implant of zirconium, i.e. $10^{17}$ ions of zirconium per square centimeter (cm$^2$). In an embodiment, the layer of zirconium 214 is implanted at 100 electron volts (eV) into the surface of the trenches 210 in the oxide layer 208 using a varying angle implant ($\alpha$), as represented by arrows 211, where the angle of implantation is changed from normal to the wafer surface to 15 degrees off normal. Using a varying angle implant, where an angle of implantation is changed from normal to the planarized surface 209 to approximately 15 degrees off normal deposits the adhesion/barrier layer 214 on all surfaces in trench 210, or in the number of trenches. Also, in various embodiments, in forming the adhesion/barrier layer 214, refractory metals can be employed, such as tantalum, tungsten, molybdenum, hafnium, niobium, rhenium, osmium, ruthenium, zirconium, titanium, vanadium, chromium and manganese. In some embodiments, alloys of Ta or W with N, Zr, Ti, or Hf are employed. The structure is now as appears in FIG. 2D.

Figure 2E:
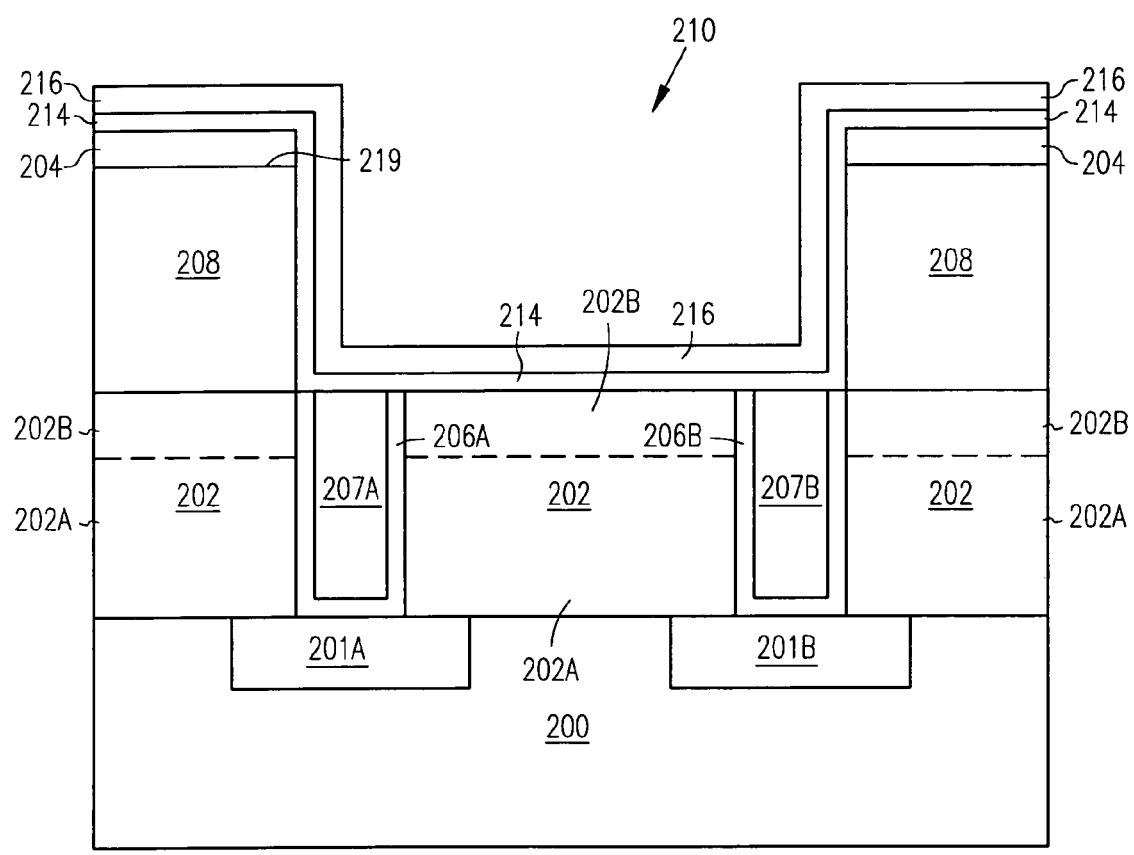

In FIG. 2E, a seed layer 216 is deposited on adhesion/barrier layer 214. In an embodiment, seed layer is deposited using a low energy ion implantation at energies ranging from 100 electron volts (eV) to 2000 electron volts (eV). In another embodiment, seed layer 216 is deposited by CVD. In various embodiments, seed layer 216 on adhesion/barrier layer 214 includes a layer of aluminum, copper, silver, or gold. Seed layer 216 serves as a catalyst or base metal for subsequent electroless plating or electroplating of a core conducting layer and as an adhesion layer preventing delamination of subsequently electrolessly deposited or electroplated metal. In various embodiments, forming the seed layer includes forming a layer of one or more refractory metals such as tantalum, tungsten, molybdenum, hafnium, niobium, rhenium, osmium, ruthenium, zirconium, titanium, vanadium, chromium and manganese. In an embodiment, a copper seed layer is utilized for a core conducting layer of copper. In an embodiment, seed layer 216 includes a layer of copper having a thickness of approximately a 100 Å. This can be achieved using an $8\times10^{16}$ ion implant of copper using a low energy ion implantation. The structure is now as shown in FIG. 2E.

Figure 2F:
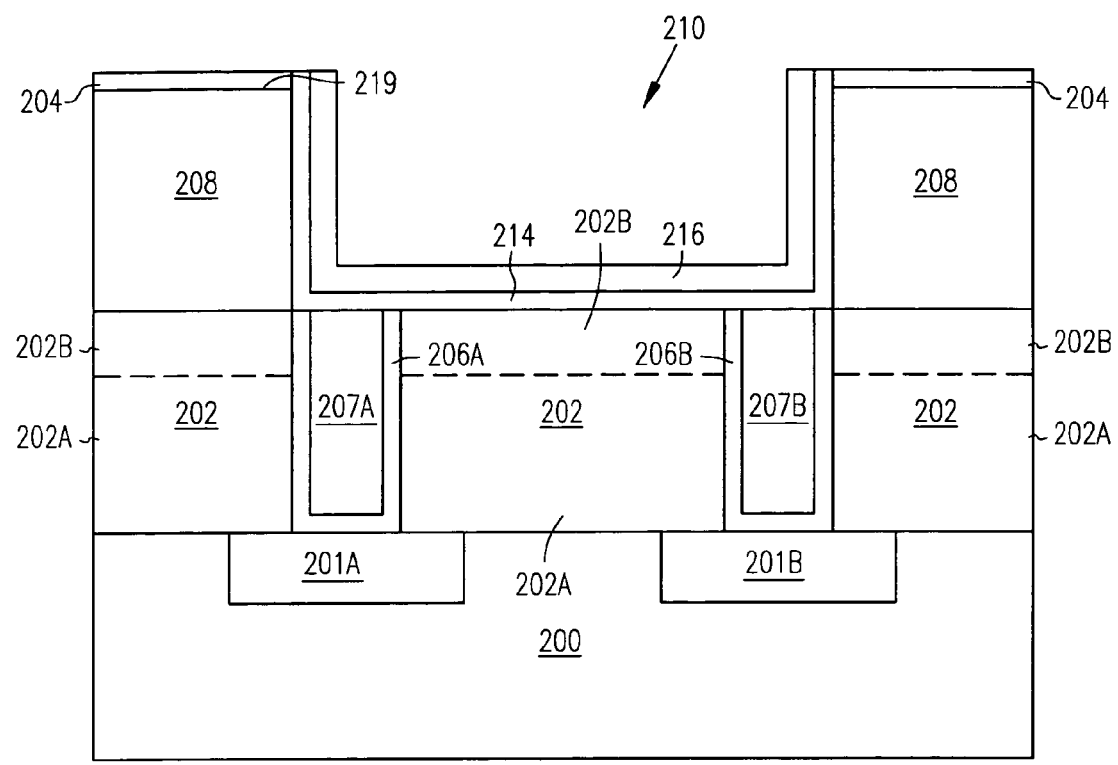

After seed layer 216 is deposited, if the fill is to be electroplating, the plating process is performed. Following electroplating the material deposited upon the surface of the wafer is removed, by chemical mechanical polishing, stopping on the silicon nitride. If electroless plating is to be used the seed/barrier layer deposited on the surface of the wafer is removed by chemical mechanical polishing stopping on the nitride layer. This removes portions of adhesion/barrier layer 214 and seed layer 216 that were deposited on the resist layer 203, leaving adhesion/barrier layer 214 and seed layer 216 extending only in the trench 210 to approximately the level of the top surface of $Si_3N_4$ layer 204 (top dielectric layer 204). The structure is shown in FIG. 2F. In an alternate embodiment, when barrier and seed layers 214 and 216 are removed, $Si_3N_4$ layer 204 is also removed.

Figure 2G:
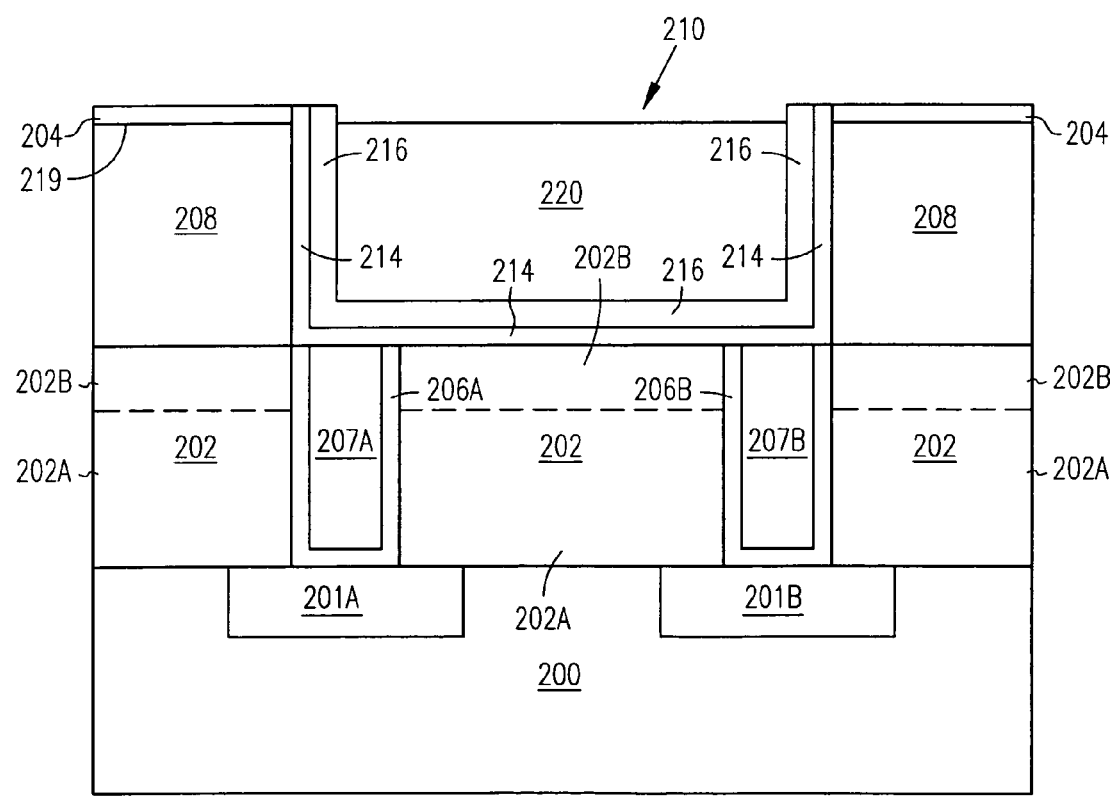

In FIG. 2G, a core conducting layer 220, or a number of first level metal lines 220, has been deposited over seed layer 216 in trench 210, or in a number of trenches. Core conducting layer 220, or number of first level metal lines 220, may be a layer of aluminum, copper, silver, or gold depending on the type of seed layer 216 deposited. Core conducting layer 220 is electrolessly plated into trench 210 on seed layer 216 to a thickness which causes the metal layer 220 to extend to about the level of a top surface 219 of oxide layer 208. In an embodiment, copper is electroless plated onto seed layer 216. In an embodiment, forming conductive layer 220 includes electroless plating copper in an ambient air environment. Electroless copper plating is used to selectively deposit copper with a thickness slightly less than the thickness of oxide layer 208, that is, the nominal copper thickness plus the deposition tolerance equals the thickness of oxide layer 208.

Figure 2H:
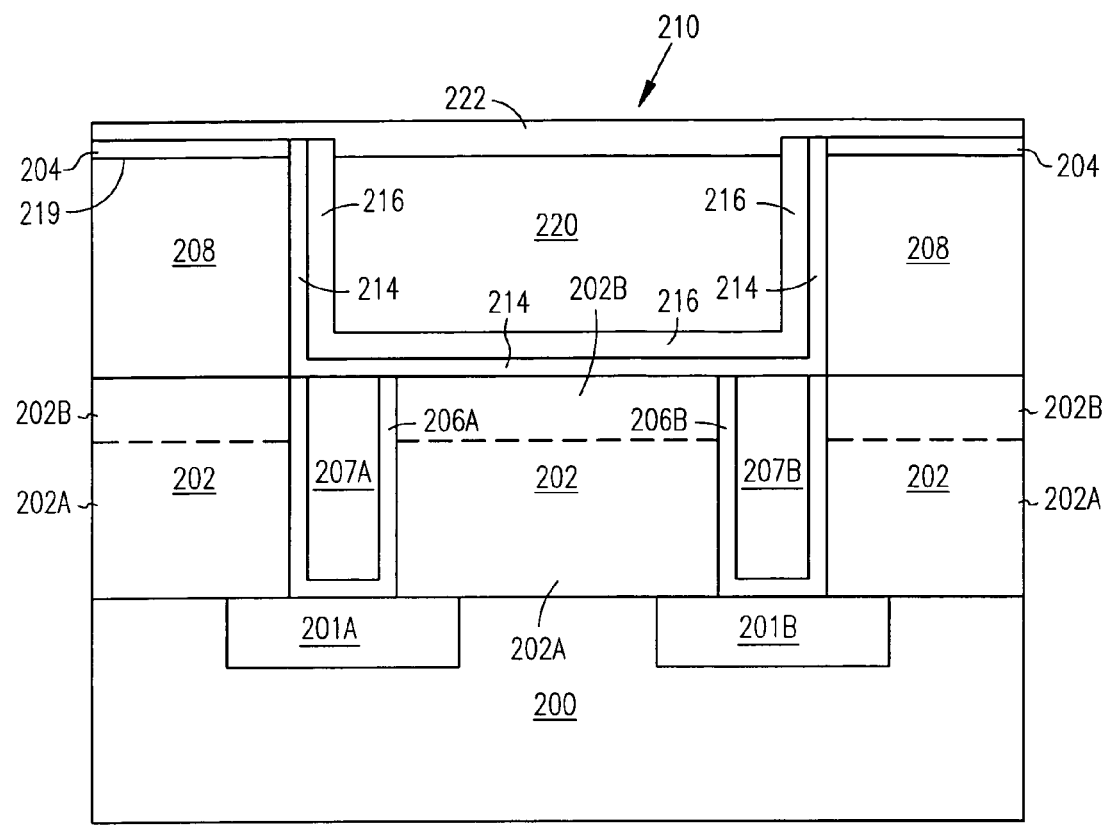

Core conducting layer 220 is subjected to a $H_2$ plasma treatment. This removes unwanted oxide from the surface of core conducting layer 220. Referring to FIG. 2H, the surface of core conducting layer 220 is then implanted with dopant to form a capping adhesion/barrier layer 222 to prevent metal contamination. In various embodiments, the dopant is a material such as aluminum, boron, chromium, molybdenum, tungsten, titanium, zirconium, hafnium, magnesium, vanadium, columbium, or tantalum or oxides or nitrides of these elements. In an embodiment, core conducting layer is copper and the dopant is titanium. Titanium is implanted at an energy of about 0.5 keV and at a concentration of about $5\times10^{16}$ ions/$cm^2$, penetrating the copper core conducting layer 220 to an average depth of about 10 Å. In an embodiment, the titanium is implanted at an energy level of about 0.125 keV to 2.0 keV and at a concentration of about $1.25\times10^{16}$ ions/$cm^2$ to about $2.0\times10^{17}$ ions/$cm^2$. In other embodiments using other dopants, the implant energy and the concentration can range from about 0.125 to about 2.0 keV and about $1.25\times10^{16}$ to about $2\times10^{17}$ ions/$cm^2$, respectively. In an embodiment, capping adhesion/barrier layer ranges from about 5 Å to about 40 Å thick. In an embodiment, capping adhesion/barrier layer is around 20 Å thick.

In a Ti ion implantation process in which Ti ions penetrate through $Si_3N_4$ layer 204 and are implanted into oxide layer 204, a region of dielectric material containing TiO, $TiO_2$, and/or $TiO_x$, is formed in oxide layer 204. In an alternate process in which $Si_3N_4$ layer 204 is removed when removing resist layer 203, during implanting into copper layer 220 titanium is also implanted into oxide layer 208 at an average distance of about 20 Å using an implant energy of about 0.5 keV. In other embodiments, the titanium is deposited using other deposition processes as alternatives to ion implantation.

Capping adhesion/barrier layer 222 may be exposed to a nitrogen to form a conducting nitride on core conducting layer 220. In an embodiment, titanium layer 222 is exposed to a nitrogen plasma at 350° C. to form a TiN layer 222 on copper core conducting layer 220. With a region of oxide layer 204 containing $TiO_x$, a nitrogen exposure process may form a region containing TiO, $TiO_2$, and/or a $TiO(N)_x$. The structure with conducting layer 220 having capping adhesion/barrier layer 222 is shown in FIG. 2H. In an embodiment in which oxide layer 208 having implanted titanium is exposed to nitrogen plasma, a TiO, $TiO_2$, and/or a $TiO(N)_x$ layer is formed on oxide layer 208.

Figure 2I:
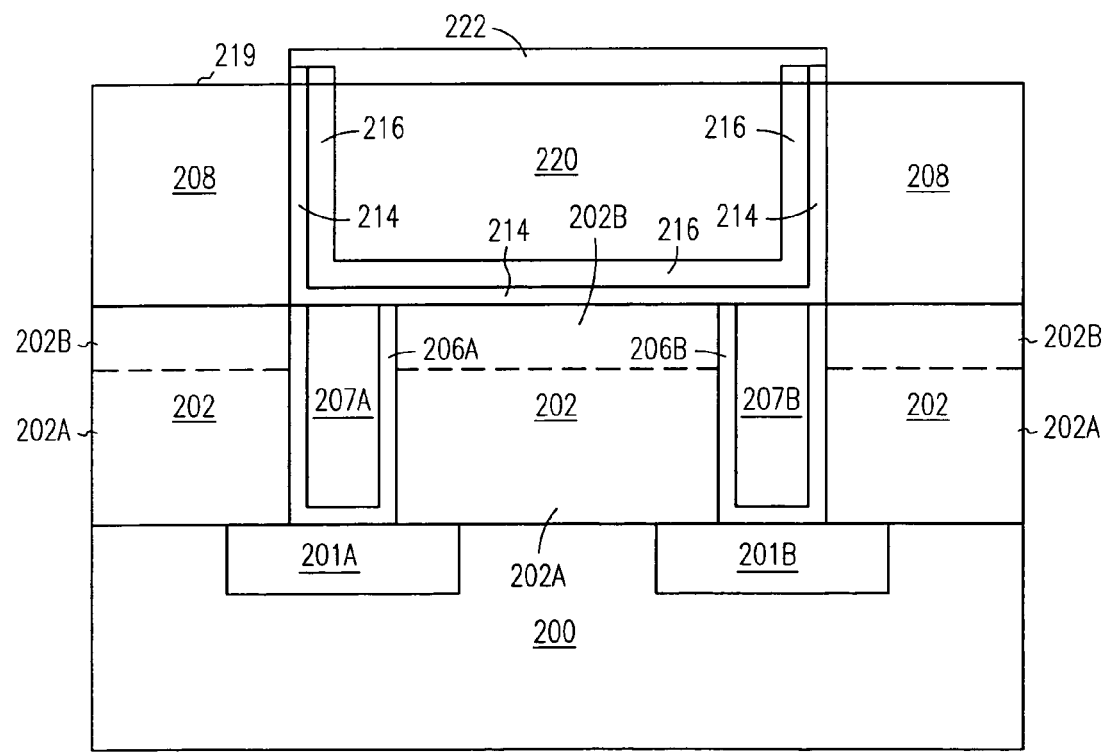

In embodiments in which $Si_3N_4$ layer 204 is present during formation of capping adhesion/barrier layer 222, $Si_3N_4$ layer 204 (top dielectric layer 204) is then removed with negligible effect on oxide layer 208. In an embodiment, $Si_3N_4$ layer 204 is removed by an etchant, such as hot phosphoric acid ($H_3PO_4$) at a temperature of about 180° C. at a etch rate of about 80 Å/min., which selectively attacks the top dielectric layer 204 and not the oxide layer 208. Any TiN formed in $Si_3N_4$ layer 204 is removed leaving first oxide layer 208 free of impurities (i.e. TiN). In addition, the remaining part of the conducting layer containing adhesion/barrier layer 214 and seed layer 216 not in contact with core conducting layer 220 and capping adhesion/barrier layer 222 is removed along with the removal of $Si_3N_4$ layer 204. This structure is shown in FIG. 2I. The resulting core conducting layer 220 and capping adhesion/barrier layer 222 can be utilized in an interconnect system for an integrated circuit coupling passive and/or active components such as capacitors, transistors, various memory devices, and various electronic devices and systems.

The formation of the metallization structure as discussed with respect to FIGS. 2A-2H describes a single damascene structure, other implementations using dual damascene can be constructed using appropriate masking steps. The process is then repeated as many times as necessary to build the multi-level wiring layers desired.

Figure 3A:
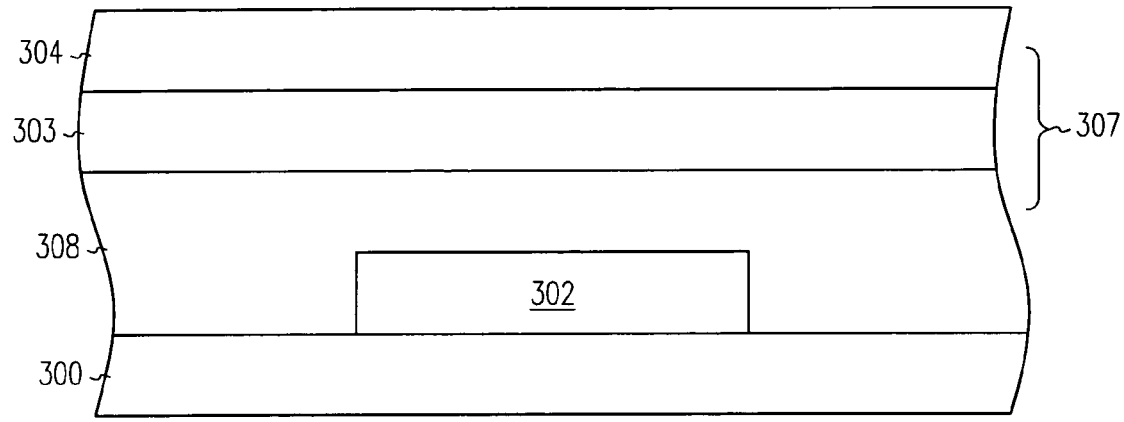
FIG. 3A shows an embodiment of a process element for forming a wiring/metallization structure, according to the teachings of the present invention.

FIG. 3A shows an embodiment of a process element for forming a wiring/metallization structure. FIG. 3A illustrates a multilayer dielectric structure 307 supported by a substrate 300 in which a damascene structure is formed. Multilayer dielectric structure 307 includes a lower insulator layer 308, a intermediate dielectric layer 303, and a top dielectric layer 304 disposed over a wafer surface. Lower insulator 308 will provide the insulating layer in which a conducting structure will be formed, while intermediate dielectric layer 303 and top dielectric 304 provide sacrificial layers for the fabrication process. In various embodiments, a number of different dielectrics can be used to realize each of these layers 308, 303, 304. In an embodiment as shown in which FIG. 3A, the multilayer dielectric structure 307 is formed over a contact plug 302. In this embodiment, contact plug 302 has at least a portion of its body above supporting substrate 300, rather than completely in a contact hole. From the stage of the process shown in FIG. 3A, an embodiment for a processing method includes forming a first conductive layer in an opening that has been formed in the multilayer dielectric structure 307, forming a core conductive layer on the first conductive layer, subjecting the core conductive layer to a $H_2$ plasma treatment, and depositing a capping adhesion/barrier layer on the core conductive layer after the $H_2$ plasma treatment. In an embodiment, lower insulating layer 308 is a polymer layer. The structure for an embodiment shown in FIG. 3A can be processed as previously described for a polymer insulating layer, including a polyimide insulating layer, with respect to FIGS. 1B-1H.

Figure 3B:
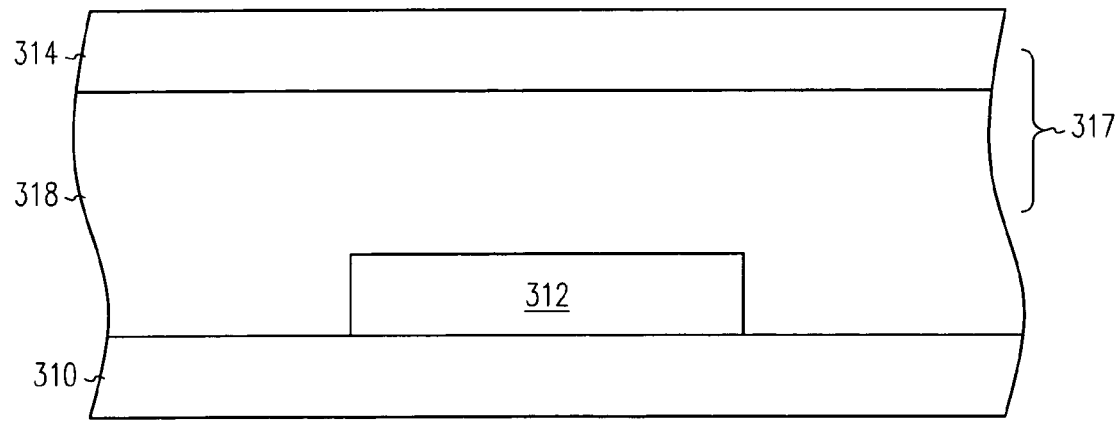
FIG. 3B shows another embodiment of a process element for forming a wiring/metallization structure, according to the teachings of the present invention.

FIG. 3B shows another embodiment of a process element for forming a wiring/metallization structure. FIG. 3B illustrates a multilayer dielectric structure 317 supported by a substrate 310 in which a damascene structure is formed. Multilayer dielectric structure 317 includes a lower insulator layer 318, and a top dielectric layer 314 disposed over a wafer surface. Lower insulator 318 will provide the insulating layer in which a conducting structure will be formed, while top dielectric 314 provides a sacrificial layer for the fabrication process. In various embodiments, a number of different dielectrics can be used to realize each of these layers 318, 314. In an embodiment as shown in which FIG. 3B, the multilayer dielectric structure 317 is formed over a contact plug 312. In this embodiment, contact plug 312 has at least a portion of its body above supporting substrate 310, rather than completely in a contact hole. From the stage of the process shown in FIG. 3B, an embodiment for a processing method includes forming a first conductive layer in an opening that has been formed in the multilayer dielectric structure 317, forming a core conductive layer on the first conductive layer, subjecting the core conductive layer to a $H_2$ plasma treatment, and depositing a capping adhesion/barrier layer on the core conductive layer after the $H_2$ plasma treatment. In an embodiment, lower insulating layer 318 is an oxide layer. The structure for an embodiment shown in FIG. 3B can be processed as previously described for an oxide insulating layer with respect to FIGS. 2B-2I.

Figure 4:
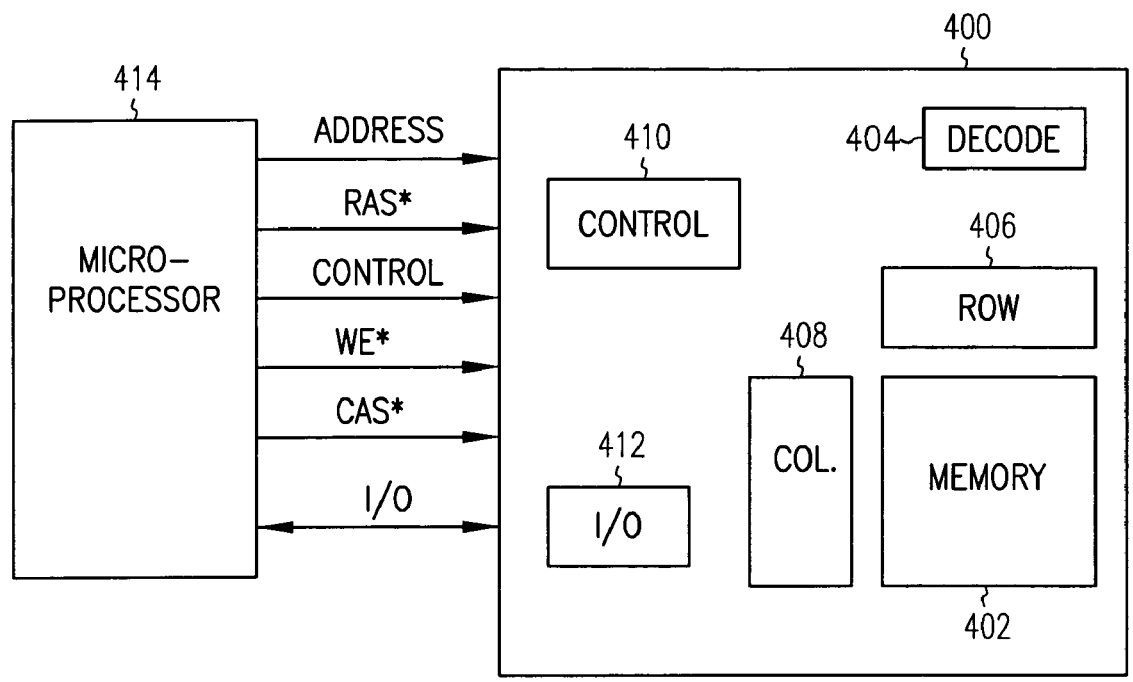
FIG. 4 is a simplified block diagram of a memory device using an embodiment for a wiring structure according to the teachings of the present invention.

FIG. 4 is a simplified block diagram of a memory device 400 using an embodiment for wiring structure according to the teachings of the present invention. Memory device 400 includes an array of memory cells 402, address decoder 404, row access circuitry 406, column access circuitry 408, control circuitry 410, and input/output (I/O) circuit 412. The memory is operably coupled to an external microprocessor 414, or memory controller for memory accessing. Memory device 400 receives control signals from processor 414, such as WE*, RAS* and CAS* signals, which can be supplied on a system bus. Memory device 400 stores data that is accessed via I/O lines. It will be appreciated by those skilled in the art that additional circuitry and control signals can be provided, and that the memory device of FIG. 4 has been simplified to help focus on embodiments of the present invention. At least one of the structures associated with memory device 400 uses a wiring structure in a substrate in accordance with an embodiment of the present invention.

It will be understood that the above description of a memory device is intended to provide a general understanding of the memory and is not a complete description of all the elements and features of a specific type of memory, such as DRAM (Dynamic Random Access Memory). Further, embodiments are equally applicable to any size and type of memory circuit and are not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Figure 5:
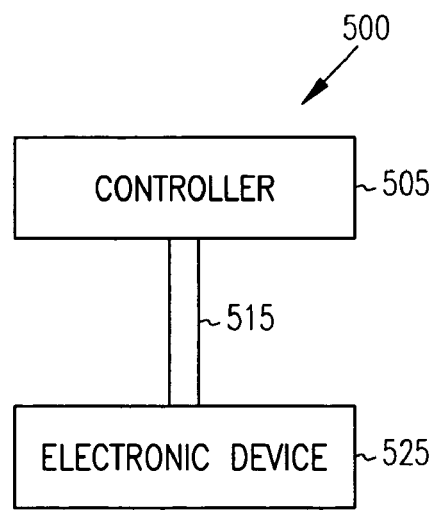
FIG. 5 illustrates a block diagram for an embodiment of an electronic system having devices using a wiring structure according to the teachings of the present invention.

FIG. 5 illustrates a block diagram for an embodiment of an electronic system 500 having devices using a wiring structure according to the teachings of the present invention. Electronic system 500 includes a controller 505, a bus 515, and an electronic device 525, where bus 515 provides electrical conductivity between controller 505 and electronic device 525. In various embodiments, controller 505 and/or electronic device 525 includes an embodiment for a wiring structure as discussed herein. In an embodiment, electronic system 500 includes a plurality of electronic devices using an embodiment for a wiring structure according to the present invention. Electronic system 500 may include, but is not limited to, information handling devices, wireless systems, telecommunication systems, fiber optic systems, electro-optic systems, and computers.

Applying a $H_2$ plasma treatment to a core conducting layer in a damascene structure prior to forming a capping adhesion/barrier layer on the core conducting layer provides a method for removing unwanted oxides and sub-oxides from the surface of the core conducting layer. Electronic devices and systems constructed having metallizations using such a process are provided with interconnection metallizations with enhanced conductivity properties. These enhanced conductivity (reduced resistivity) properties are provided in part by a interconnection structure in which the interface between the core conducting layer and a capping adhesion/barrier layer is substantially free of oxides. Embodiments for methods in line with the embodiments described herein provide for the use of highly conducting metals such as copper and silver. In embodiments, these copper or silver structures are insulated using polymer layers or oxide layers that can be fabricated in a variety of different forms such as, but not limited to, foamed materials or fluorinated materials.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of the present invention. It is to be understood that the above description is intended to be illustrative, and not restrictive. Combinations of the above embodiments, and other embodiments, will be apparent to those of skill in the art upon reviewing the above description. The scope of the present invention includes any other applications in which the above structures and fabrication methods are used. The scope of the present invention should be determined with reference to the appended claims, along with the full scope of equivalents to which such claims are entitled.

What is claimed is:

1. An electronic device comprising:
   an insulating layer; and
   a conductive structure within the insulating layer, the conductive structure including:
   a first conducting layer structured as two conductive layers;
   a core conductor disposed on and within the first conducting layer; and
   a capping layer disposed on and covering the core conductor and the first conducting layer, the capping layer being a conductor, the capping layer in contact with at least a center portion of the core conductor and a top portion of the two conductive layers of the first conducting layer such that contact with the first conducting layer is limited to the top portion and inner surfaces of the first conducting layer, the inner surfaces containing the core conductor, the capping layer having at least one property from a group of an adhesion property and a barrier property, wherein an interface between the capping layer and the core conductor is substantially free of an oxide.

2. The electronic device of claim 1, wherein a top surface of the core conductor is substantially at a level with a top surface of the insulating layer.

3. The electronic device of claim 1, wherein the two conductive layers are structured as a first layer and a seed layer, the first layer having at least one property from the group of an adhesion property and a barrier property.

4. The electronic device of claim 3, wherein the first layer includes a refractory metal, a compound of nitrogen and a tantalum alloy, or a compound of nitrogen and a tungsten alloy.

5. The electronic device of claim 1, wherein the core conductor includes copper, silver, a copper alloy, or a silver alloy.

6. The electronic device of claim 1, wherein the capping layer includes titanium, zirconium, hafnium, or nitrides of titanium, zirconium, or hafnium.

7. The electronic device of claim 1, wherein the capping layer has a thickness ranging from about 5 Å to about 40 Å.

8. The electronic device of claim 1, wherein the insulating layer includes a polymer layer, a foamed polymer layer, or a fluorinated polymer layer.

9. The electronic device of claim 1, wherein the insulating layer includes a polyimide layer, a foamed polyimide layer, or a fluorinated polyimide layer.

10. The electronic device of claim 1, wherein the insulating layer includes an oxide layer, a fluorinated oxide layer, a silicon dioxide layer, or an aerogel layer.

11. The electronic device of claim 1, wherein the insulating layer is disposed on a dielectric structure having a via to connect to lower level metallizations or devices in a substrate.

12. The electronic device of claim 1, wherein a portion of the insulating layer includes an opening between the core conductor and another conductor to provide an air bridge structure.

13. The electronic device of claim 1, wherein the conductive structure includes a wiring structure in an integrated circuit.

14. The electronic device of claim 1, wherein the conductive structure includes a wiring structure in a memory device.

15. The electronic device of claim 1, wherein the conductive structure includes a wiring structure in a controller coupled to an integrated circuit in an electronic system.

16. The electronic device of claim 1, wherein the core conductive structure essentially consists of aluminum, silver, gold, or combinations thereof, the core conductive structure having a hydrogen-plasma treated surface to provide the interface between the capping layer and the core conductor substantially free of an oxide.

17. An integrated circuit comprising:
one or more active devices in a substrate; and
a wiring structure coupled to at least one of the active devices, at least a portion of the wiring structure including:
a first level via in a first insulator layer;
a first conducting layer formed over and connecting to the first level via in the first insulator layer, the first conducting layer structured as two conductive layers;
a core conductor disposed on and within the first conducting layer; and
a capping layer disposed on and covering the core conductor and the first conducting layer, the capping layer being a conductor, the capping layer in contact with at least a center portion of the core conductor and a top portion of the. two conductive layers of the first conducting layer such that contact with the first conducting layer is limited to the top portion and inner surfaces of the first conducting layer, the inner surfaces containing the core conductor, the capping layer, the first conducting layer, and the core conductor being within a second insulator layer, the capping layer having at least one property from a group of an adhesion property and a barrier property, wherein an interface between the capping layer and the core conductor is substantially free of an oxide.

18. The integrated circuit of claim 17, wherein the two conductive layers are structured as a first layer and a seed layer, the first layer having at least one property from a group of an adhesion property and a barrier property.

19. The integrated circuit of claim 18, wherein the first layer includes a refractory metal, a compound of nitrogen and a tantalum alloy, or a compound of nitrogen and a tungsten alloy.

20. The integrated circuit of claim 17, wherein the core conductor includes copper, silver, a copper alloy, or a silver alloy.

21. The integrated circuit of claim 17, wherein the capping layer includes titanium, zirconium, hafnium, or nitrides of titanium, zirconium, or hafnium.

22. The integrated circuit of claim 17, wherein the capping layer has a thickness ranging from about 5 Å to about 40 Å.

23. The integrated circuit of claim 17, wherein the second insulator layer includes a polymer layer, a foamed polymer layer, or a fluorinated polymer layer.

24. The integrated circuit of claim 17, wherein the second insulator layer includes a polyimide layer, a foamed polyimide layer, or a fluorinated polyimide layer.

25. The integrated circuit of claim 17, wherein the second insulator layer includes an oxide layer, a fluorinated oxide layer, or an aerogel layer.

26. The integrated circuit of claim 17, wherein a top surface of the core conductor is substantially at a level with a top surface of the second insulator layer.

27. The integrated circuit of claim 17, further including a gap between two or more core conductors to provide an air bridge structure.

28. A memory device comprising:
an array of memory cells in a substrate; and
a wiring structure in the substrate coupling to the array of memory cells, at least a portion of the wiring structure including:
a first level via in a first insulator layer;
a first conducting layer formed over and connecting to the first level via in the first insulator layer, the first conducting layer structured as two conductive layers;
a core conductor disposed on and within the first conducting layer; and
a capping layer disposed on and covering the core conductor and the first conducting layer, the capping layer being a conductor, the capping layer in contact with at least a center portion of the core conductor and a top portion of the two conductive layers of the first conducting layer such that contact with the first conducting layer is limited to the top portion and inner surfaces of the first conducting layer, the inner surfaces containing the core conductor, the capping layer, the first conducting layer, and the core conductor being within a second insulator layer, the capping layer having at least one property from a group of an adhesion property and a barrier property, wherein an interface between the capping layer and the core conductor is substantially free of an oxide.

29. The memory device of claim 28, wherein the two conductive layers are structured as a first layer and a seed layer, the first layer having at least one property from a group of an adhesion property and a barrier property.

30. The memory device of claim 29, wherein the first layer includes a refractory metal, a compound of nitrogen and a tantalum alloy, or a compound of nitrogen and a tungsten alloy.

31. The memory device of claim 28, wherein the core conductor includes copper, silver, a copper alloy, or a silver alloy.

32. The memory device of claim 28, wherein the capping layer includes titanium, zirconium, hafnium, or nitrides of titanium, zirconium, or hafnium.

33. The memory device of claim 28, wherein the capping layer has a thickness ranging from about 5 Å to about 40 Å.

34. The memory device of claim 28, wherein the second insulator layer includes a polymer layer, a foamed polymer layer, or a fluorinated polymer layer.

35. The memory device of claim 28, wherein the second insulator layer includes a polyimide layer, a foamed polyimide layer, or a fluorinated polyimide layer.

36. The memory device of claim 28, wherein the second insulator layer includes an oxide layer, a fluorinated oxide layer, or an aerogel layer.

37. The memory device of claim 28, wherein a top surface of the core conductor is substantially at a level with a top surface of the second insulator layer.

38. An electronic system comprising:
a controller; and
one or more integrated circuits coupled to the controller, at least one integrated circuit having a wiring structure with at least a portion of the wiring structure including:
an insulating layer;
a conductive structure within the insulating layer, the conductive structure having:
a first conducting layer structured as two conductive layers;
a core conductor disposed on and within the first conducting layer; and
a capping layer disposed on and covering the core conductor and the first conducting layer, the capping layer being a conductor, the capping layer in contact with at least a center portion of the core conductor and a top portion of the two conductive layers of the first conducting layer such that contact with the first conducting layer is limited to the top portion and inner surfaces of the first conducting layer, the inner surfaces containing the core conductor, the capping layer having at least one property from a group of an adhesion property and a barrier property, wherein an interface between the capping layer and the core conductor is substantially free of an oxide.

39. The electronic system of claim 38, wherein a top surface of the core conductor is substantially at a level with a top surface of the insulating layer.

40. The electronic system of claim 38, wherein the two conductive layers are structured as a first layer and a seed layer, the first layer having at least one property from a group of an adhesion property and a barrier property.

41. The electronic system of claim 40, wherein the first layer includes a refractory metal, a compound of nitrogen and a tantalum alloy, or a compound of nitrogen and a tungsten alloy.

42. The electronic system of claim 38, wherein the core conductor includes copper, silver, a copper alloy, or a silver alloy.

43. The electronic system of claim 38, wherein the capping layer includes titanium, zirconium, hafnium, or nitrides of titanium, zirconium, or hafnium.

44. The electronic system of claim 38 wherein the capping layer has a thickness ranging from about 5 Å to about 40 Å.

45. The electronic system of claim 38, wherein the insulating layer includes a polymer layer, a foamed polymer layer, or a fluorinated polymer layer.

46. The electronic system of claim 38, wherein the insulating layer includes a polyimide layer, a foamed polyimide layer, or a fluorinated polyimide layer.

47. The electronic system of claim 38, wherein the insulating layer includes an oxide layer, a fluorinated oxide layer, a silicon dioxide layer, or an aerogel layer.

48. The electronic system of claim 38, wherein the insulating layer is disposed on a dielectric structure having a via to connect to lower level metallizations or devices in a substrate.

49. The electronic system of claim 38, wherein the controller includes a processor.

50. The electronic system of claim 38, wherein the electronic system includes a computer.

* * * * *

UNITED STATES PATENT AND TRADEMARK OFFICE
CERTIFICATE OF CORRECTION

| | | |
|---|---|---|
| PATENT NO. | : 7,504,674 B2 | Page 1 of 1 |
| APPLICATION NO. | : 11/215367 | |
| DATED | : March 17, 2009 | |
| INVENTOR(S) | : Farrar | |

It is certified that error appears in the above-identified patent and that said Letters Patent is hereby corrected as shown below:

In column 14, line 7, in Claim 17, delete "the. two" and insert -- the two --, therefor.

Signed and Sealed this

Thirtieth Day of June, 2009

JOHN DOLL
*Acting Director of the United States Patent and Trademark Office*